US006760259B1

(12) United States Patent
Futatsuya et al.

(10) Patent No.: US 6,760,259 B1

(45) Date of Patent: Jul. 6, 2004

(54) NON-VOLATILE SEMICONDUCTOR MEMORY DEVICE THAT CAN BE FABRICATED WITH ERASURE UNIT MODIFIED

(75) Inventors: Tomoshi Futatsuya, Hyogo (JP); Takashi Hayasaka, Hyogo (JP); Taku Ogura, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/624,599

(22) Filed: Jul. 23, 2003

(30) Foreign Application Priority Data

Jan. 27, 2003 (JP) ....................................... 2003-017568

(51) Int. Cl.[7] ................................................ G11C 16/16

(52) U.S. Cl. ............................ 365/185.33; 365/185.29; 365/185.11; 365/185.23

(58) Field of Search ....................... 365/185.11, 185.12, 365/185.13, 185.23, 185.33, 185.29

(56) References Cited

U.S. PATENT DOCUMENTS 5,856,942 A * 1/1999 Lee et al. .............. 365/185.11
6,064,596 A * 5/2000 Choi et al. ............. 365/185.22

FOREIGN PATENT DOCUMENTS

| | | | |
|---|---|---|---|
| JP | 6-131889 | 5/1994 | ........... G11C/16/06 |
| JP | 10-106278 | 4/1998 | ........... G11C/16/02 |
| JP | 11-250672 | 9/1999 | ........... G11C/16/02 |
| JP | 2002-133877 | 5/2002 | ........... G11C/16/02 |

* cited by examiner

*Primary Examiner*—Andrew Q. Tran
(74) *Attorney, Agent, or Firm*—McDermott, Will & Emery

(57) ABSTRACT

Particular blocks are a boot block and parameter block having a storage capacity smaller than that of a general block. In the case where a boot block is not required, a signal BOOTE is set at an L level. In the case where a signal BLKSEL is at an H level in an erasure mode, a control unit selects four blocks aligned in a horizontal direction at the same time. The control unit also selects two blocks simultaneously in the vertical direction. As a result, the particular eight blocks are selected. The boot block and parameter block can be erased collectively as one block having a capacity similar to that of a general block. Therefore, a flash memory corresponding to the case of including a boot block and not including a boot block can be implemented simultaneously with one chip. Thus, the designing and fabrication process can be simplified.

20 Claims, 24 Drawing Sheets

1
INPUT/OUTPUT
DATA BUFFER
22
DQ0~DQ15
2
4
PROGRAM &
VERIFY CIRCUIT
SENSE
AMPLIFIER
6
INTERNAL
CONTROLLER
8
CE,WE,OE,RP,WP
24
26
Y GATE
BLKSEL,…
ext.A0~
ext.A18
ADDRESS
BUFFER
A0~
A18
PREDECODER
16
18
10
SWITCH SIGNAL
GENERATION
CIRCUIT
POR
BOOTE
ROW-
COLUMN
DECODER
20
B000
B001
B002
B003
B004
B005
B006
B007
B100
B008
B009
B010
B011
B012
B013
B014
B015
B016
B017
B018
B019
B020
B021
B022

| #NOBOOT | #BOOT | BOOTE |
|---|---|---|
| L | H or OPEN | L |
| H or OPEN | L | H |

BOOTE,BLKSEL
A15
A16
A17
A18
A14,A17,A18
A12,A13,A15,A16
A6~A15
A0~A5
62
BOP
18
64
VERTICAL BLOCK SELECT CIRCUIT
66
HORIZONTAL BLOCK SELECT CIRCUIT
68
PREDECODE CIRCUIT
70
PREDECODE CIRCUIT
BAVS0,BAVS1, BAVM0~BAVM3
BAH0~BAH3
PDROW
PDCOL
72
ROW DECODER
74
COLUMN DECODER

| #BOOT | BOOTE |
|---|---|
| L | H |
| H or OPEN | L |

| LT FUSE | BOOTE |
|---|---|
| BURN OUT | H |
| CONDUCT | L |

| MEMORY TRANSISTOR Vth | BOOTE |
|---|---|
| HIGH | H |
| LOW | L |

221
DQ0~DQ15
CE,WE,OE,RP,WP
A0~A18
POR
INPUT/OUTPUT DATA BUFFER
22
INTERNAL CONTROLLER
8A
2A
ADDRESS BUFFER
16
PREDECODER
18A
SWITCH SIGNAL GENERATION CIRCUIT
10
BOOTE
PROGRAM & VERIFY CIRCUIT
4
SENSE AMPLIFIER
6
Y GATE
24
ROW-COLUMN DECODER
20
26
B000
B001
B002
B003
B004
B005
B006
B007
B100
B008
B009
B010
B011
B012
B013
B014
B015
B016
B017
B018
B019
B020
B021
B022

| | | | | |
|---|---|---|---|---|
| CORRESPONDING TO BOTTOM BOOT | B000 | B001 | B002 | B003 |
| | B004 | B005 | B006 | B007 |
| | B100 | B008 | B009 | B010 |
| | B011 | B012 | B013 | B014 |
| | B015 | B016 | B017 | B018 |
| | B019 | B020 | B021 | B200 |
| CORRESPONDING TO TOP BOOT | B022 | B023 | B024 | B025 |
| | B026 | B027 | B028 | B029 |

| B000 | B001 | B002 | B003 |
|---|---|---|---|
| B004 | B005 | B006 | B007 |
| B100 | B008 | B009 | B010 |
| B011 | B012 | B013 | B014 |
| B015 | B016 | B017 | B018 |
| B019 | B020 | B021 | B022 |

306

| B023 | B024 | B025 | B026 |
|---|---|---|---|
| B027 | B028 | B029 | B030 |
| B031 | B032 | B033 | B034 |
| B035 | B036 | B037 | B200 |
| B038 | B039 | B040 | B041 |
| B042 | B043 | B044 | B045 |

| B000 | B001 | B002 | B003 |
| --- | --- | --- | --- |
| B004 | B005 | B006 | B007 |
| B008 | B009 | B010 | B011 |
| B012 | B013 | B014 | B015 |

318

| B016 | B017 | B018 | B019 |
| --- | --- | --- | --- |
| B020 | B021 | B022 | B023 |
| B024 | B025 | B026 | B027 |
| B028 | B029 | B030 | B200 |
| B031 | B032 | B033 | B034 |
| B035 | B036 | B037 | B038 |

A15
A16
A17
A18
562
BOP
566
ADDRESS SELECT UNIT
610
A12,A13
A15,A16
SA0, SA1
ADDRESS DECODE UNIT
612
BAH0, BAH1, BAH2, BAH3
564
582
EN
ADDRESS DECODE UNIT
584
EN
ADDRESS DECODE UNIT
A14
A17,A18
BAVS0, BAVS1
BAVM0, BAVM1, BAVM2, BAVM3
502

NON-VOLATILE SEMICONDUCTOR MEMORY DEVICE THAT CAN BE FABRICATED WITH ERASURE UNIT MODIFIED

BACKGROUND OF THE INVENTION

1. Field of the Invention

The present invention relates to a non-volatile semiconductor memory device, more particularly to a flash memory that can have the erasure unit block configuration modified.

2. Description of the Background Art

From the functional perspective, a flash memory is a collective erasure type non-volatile semiconductor memory device capable of electrical programming and erasure. The demand for flash memories in portable equipment and the like is great by virtue of its low cost and electrical erasure function, leading to active research and development. A flash memory employs as a memory cell a transistor including, for example, a floating gate to alter the threshold voltage (referred to as memory transistor, hereinafter).

FIG. 26 shows an array configuration of a conventional flash memory.

For the sake of simplification, a memory array of 8 M bits as a whole will be described with reference to FIG. 26. A memory array 500 includes blocks B000–B007, each block formed of memory cells corresponding to 4 k words (64 k bits), blocks B008–B022, each block formed of memory cells corresponding to 32 k words (512 k bits), and a block B100. Each of blocks B000–B022 corresponds to a basic unit of erasure operation in a flash memory.

Flash memories often require a region of 4 k words. Therefore, memory array 500 includes blocks B000–B007 having a storage capacity smaller than that of a general data storage region. Such regions of 4 k words are called, for example, "boot blocks" or "parameter blocks".

A boot block is a region read by the CPU of a system mounted with a flash memory at the start of the system immediately after power is turned on. A parameter block is a region where data expected to be rewritten frequently is temporarily written. The block having the storage capacity of 32 k words is used as the region to store general data and programs. A flash memory must incorporate blocks differing in size depending upon the application.

Block B100 is a region equivalent to blocks B000–B007 from the address allocation perspective, and is a non-used region. Memory block B100, even though not used, has a configuration similar to that of each of blocks B008–B022 since continuity of signals on the memory array must be maintained.

The selection of a memory block is effected by block select signals BAVS0, BAVS1, and BAVM0–BAVM3 to select a block vertical position, and block select signals BAH0–BAH3 to select a block horizontal position. When a vertical block position and a horizontal block position are both rendered active, the block corresponding to a crossing thereof is selected. For example, when block B008 is to be selected, select signals BAVM0 and BAH1 are rendered conductive whereas the remaining select signals are rendered inactive.

FIG. 27 is a block diagram of a configuration of a conventional block select decoder generating a memory block select signal.

Referring to FIGS. 26 and 27, a block select decoder 502 generates block select signals BAV0, BAVS1, BAVM0–BAVM3, and BAH0–BAH3 using address bits A12–A18 of an externally applied address signal. Block select decoder 502 includes a 4-input NOR circuit 562 receiving address bits A15, A16, A17 and A18 to output a select signal BOP, a vertical block select circuit 564 providing select signals BAVS0, BAVS1, and BAVM0–BAVM3 of the vertical position in accordance with address bits A14, A17, A18 and select signal BOP, and a horizontal block select signal 566 providing select signals BAH0–BAH3 of the horizontal position in accordance with address bits A12, A13, A15 and A16 and select signal BOP.

Vertical block select circuit 564 includes an address decode unit 582 rendered active in accordance with select signal BOP to decode address bit A14 and output signals BAVS0, BAVS1, and an address decode unit 584 operating when select signal BOP is inactive and ceasing operation when select signal BOP is rendered active. Address decode unit 584 decodes address bits A17 and A18 when active to output signals BAVM0–BAVM3.

Horizontal block select circuit 566 includes an address select unit 610 providing address bits A12 and A13 as select address bits SA0, SA1 when select signal BOP is rendered active, and providing address bits A15 and A16 as select address bits SA0, SA1 when select signal BOP is inactive and an address decode unit 612 decoding select address bits SA0, SA1 to output signals BAH0–BAH3.

In the case of a memory array of 8 M bits shown in FIG. 26, the address bits selecting a 32 k-word block are A15, A16, A17 and A18 in a 1-word 16-bit structure. The address bits selecting a 4 k-word block are A12, A13 and A14. The conventional example described here is based on a configuration in which four memory blocks are disposed in the horizontal direction as shown in FIG. 26.

First, activation/inactivation of signal BOP selecting a 4 k-word region is determined by NOR circuit 562.

When an address corresponding to memory blocks B008–B022 is input, signal BOP is rendered inactive, whereby address decode unit 582 renders signals BAVS0 and BAVS1 inactive, whereas address decode unit 584 renders active one of select signals BAVM0–BAVM3 of the vertical memory blocks active in accordance with address bits A17 and A18.

In this case, address select unit 610 outputs address bits A15 and A16 as select address bits SA0 and SA1. Therefore, address decode unit 612 decodes address bits A15 and A16 to render active one of select signals BAH0–BAH3.

When all address bits A15–A18 are at an L level (logical low), select signal BOP is rendered active. This indicates that an address is input corresponding to non-used memory block B100 of FIG. 26. In this case, a corresponding region of memory blocks B000–B007 is selected instead of selecting memory block B100. Specifically, when signal BOP is rendered active, address decode unit 584 is rendered inactive, and signals BAVM0–BAVM3 are rendered inactive. Then, address decode unit 582 decodes address bit A14 to render active one of signals BAVS0 and BAVS1.

When signal BOP is active, address select unit 610 outputs address bits A12 and A13 as select address bits SA0 and SA1. Therefore, address decode unit 512 decodes address bits A12 and A13 to render active one of signals BAH0–BAH3.

Conventionally, the block division and address allocation determined by block select decoder 502 are always fixed. In other words, the region of 8 M bits was handled as eight blocks of a 4 k-word block and fifteen blocks of a 32 k-word block B008–B022, i.e., a total of 23 blocks.

Thus, memory array 500 of FIG. 26 includes 23 blocks of memory blocks B000–B022 to be used. This means that an erasure operation must be designated from outside the chip 23 times in order to erase the entire memory array of 8 M bits.

In FIG. 26 the eight blocks of 4 k word blocks, i.e. blocks B000–B007, are allocated the least significant side of the address. This is termed a "bottom boot type". However, there is a case where a top boot type flash memory having the blocks of 4 k words allocated the most significant side of the address is required, depending upon the system employed. In order to modify a bottom boot type memory into a top boot type memory for usage, the conventional approach was to invert a particular address bit in an address input buffer.

FIG. 28 is a circuit diagram showing a configuration of such a conventional address input buffer 516.

Referring to FIG. 28, address input buffer 516 includes address inversion circuits 520, 522 and 524 switching the non-inversion/inversion of address bits A15, A16 and A17 in accordance with a signal TOP rendered active when the memory is switched to a top boot type memory for usage.

Address inversion circuit 520 includes an inverter receiving and inverting an externally applied address bit ext.A15, an inverter 528 receiving and inverting signal TOP, a NAND circuit 530 receiving an output of inverter 526 and signal TOP, a NAND circuit 532 receiving address bit ext.A15 and an output of inverter 528, and a NAND circuit 534 receiving outputs of NAND circuits 530 and 532 to output address bit A15.

Address inversion circuit 522 has an internal configuration similar to that of address inversion circuit 520, provided that an address bit ext.A16 is input and an address bit Al6 is output. Therefore, the internal configuration of address inversion circuit 522 will not be described. Address inversion circuit 524 has an internal configuration similar to that of address inversion circuit 520, provided that an address bit ext.A17 and is input and an address bit A17 is output. Therefore, the internal configuration of address inversion circuit 524 will not be described.

FIG. 29 shows an array configuration of another conventional flash memory.

Referring to FIG. 29, each of blocks B000–B015 is formed of memory cells corresponding to 32 k words (512 k bits). Memory array 700 is absent of a memory block formed of memory cells corresponding to 4 k words. Memory block 700 is an 8 Mbit region entirely configured with 16 blocks formed of memory cells corresponding to 32 k words. In contrast to memory array 500 of FIG. 26 requiring an erasure operation of 23 times to erase the 8 Mbit region, memory array 700 requires an erasure operation of 16 times for the erasure of the 8 Mbit region.

A prior art document related to block erasure is disclosed in, for example, Japanese Patent Laying-Open No. 2002-133877.

Conventionally, the block division and address allocation to each block were always fixed. Therefore, in a flash memory product of 8 M bits described with reference to FIG. 26, for example, there are a total of 23 blocks in accordance with a specification including blocks of 4 k words, i.e., 8 of 4 k word blocks and 15 of 32 k word blocks.

In a flash memory product absent of a 4 k-word block described with reference to FIG. 29, 16 of 32 k word blocks constitute 8 M bits. In other words, designing and fabrication of a memory device must be carried out as completely different products depending upon the absence/presence of a block of 4 k words.

Reflecting the increase of the storage capacity of a flash memory, a chip having a boot block of 4 k word blocks both at the least significant bit side and most significant bit side of the address has been developed in addition to those of the least significant bit side or the most significant bit side address allocation. Such a chip is referred to as a "dual boot type chip". In the case where two of the dual boot type chips are to be combined for usage as a large memory region, there is a disadvantage that the usability is degraded since blocks of 4 k words are present intermittently at the center of the address region.

SUMMARY OF THE INVENTION

In view of the foregoing, an object of the present invention is to implement simultaneously by one chip a flash memory with a 4 k-word block and a flash memory without a 4 k-word block, in a flash memory divided into a plurality of erasure blocks including a block of a small storage capacity such as a boot block, and simplify the design and fabrication thereof.

According to an aspect of the present invention, a non-volatile semiconductor memory device includes a first basic memory block, a plurality of second basic memory blocks, and an erasure control circuit. The first basic memory block has a plurality of memory cells arranged in a matrix. The first basic memory block has a first storage capacity corresponding to a unit of collective erasure. The collective erasure is not allowed in a partial region of the first basic memory block. The partial region of the first basic memory block has a second storage capacity smaller than the first storage capacity. The plurality of second basic memory blocks are provided independent of the first basic memory block. Each of the plurality of second basic memory blocks has a plurality of memory cells arranged in a matrix. Each of the plurality of second basic memory blocks has the second storage capacity. The total storage capacity of the plurality of second basic memory blocks is equal to the first storage capacity. The erasure control circuit switches, in accordance with a select signal, between a first operation of erasing one of the plurality of second basic memory blocks in accordance with an erasure command and a second operation of erasing the plurality of second basic memory blocks collectively in accordance with the erasure command.

According to another aspect of the present invention, a non-volatile semiconductor memory device includes a first basic memory block, a plurality of second basic memory blocks, and an erasure control circuit. The first basic memory block has a plurality of memory cells arranged in a matrix. The first basic memory block has a first storage capacity corresponding to a unit of collective erasure. The collective erasure is not allowed in a partial region of the first basic memory block. The partial region of the first basic memory block has a second storage capacity smaller than the first storage capacity. The plurality of second basic memory blocks are provided independent of the first basic memory block. Each of the plurality of second basic memory blocks has a plurality of memory cells arranged in a matrix. Each of the plurality of second basic memory blocks has the second storage capacity. The total storage capacity of the plurality of second basic memory blocks is equal to the first storage capacity. The erasure control circuit switches, in accordance with a switch signal, between a first operation of erasing one of the plurality of second basic memory blocks in accordance with an erasure command and a second operation of erasing the first basic memory block in accordance with the erasure command.

According to the present invention, a plurality of types of non-volatile semiconductor devices can be implemented, one type of non-volatile semiconductor memory device having each small block corresponding to the erasure unit and one type of non-volatile semiconductor memory device having all the small blocks collectively corresponding to an erasure unit by modifying the manner of applying a switch signal. The non-volatile semiconductor device of the present invention is advantageous in that the cost for developing a plurality of types and the cost of controlling fabrication can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 21 is a diagram to describe a dual boot type memory array having memory blocks of 4 k words disposed at both the bottom side and top side of an address region, based on an application of the present invention.

FIG. 22 is a diagram to explain a configuration of implementing a dual boot in the case where two chips are combined.

FIG. 23 is a diagram to explain a configuration of implementing a bottom boot in the case where two chips are combined.

FIG. 24 is a diagram to explain a configuration of implementing a top boot in the case where two chips are combined.

DESCRIPTION OF THE PREFERRED EMBODIMENTS

Figure 1:
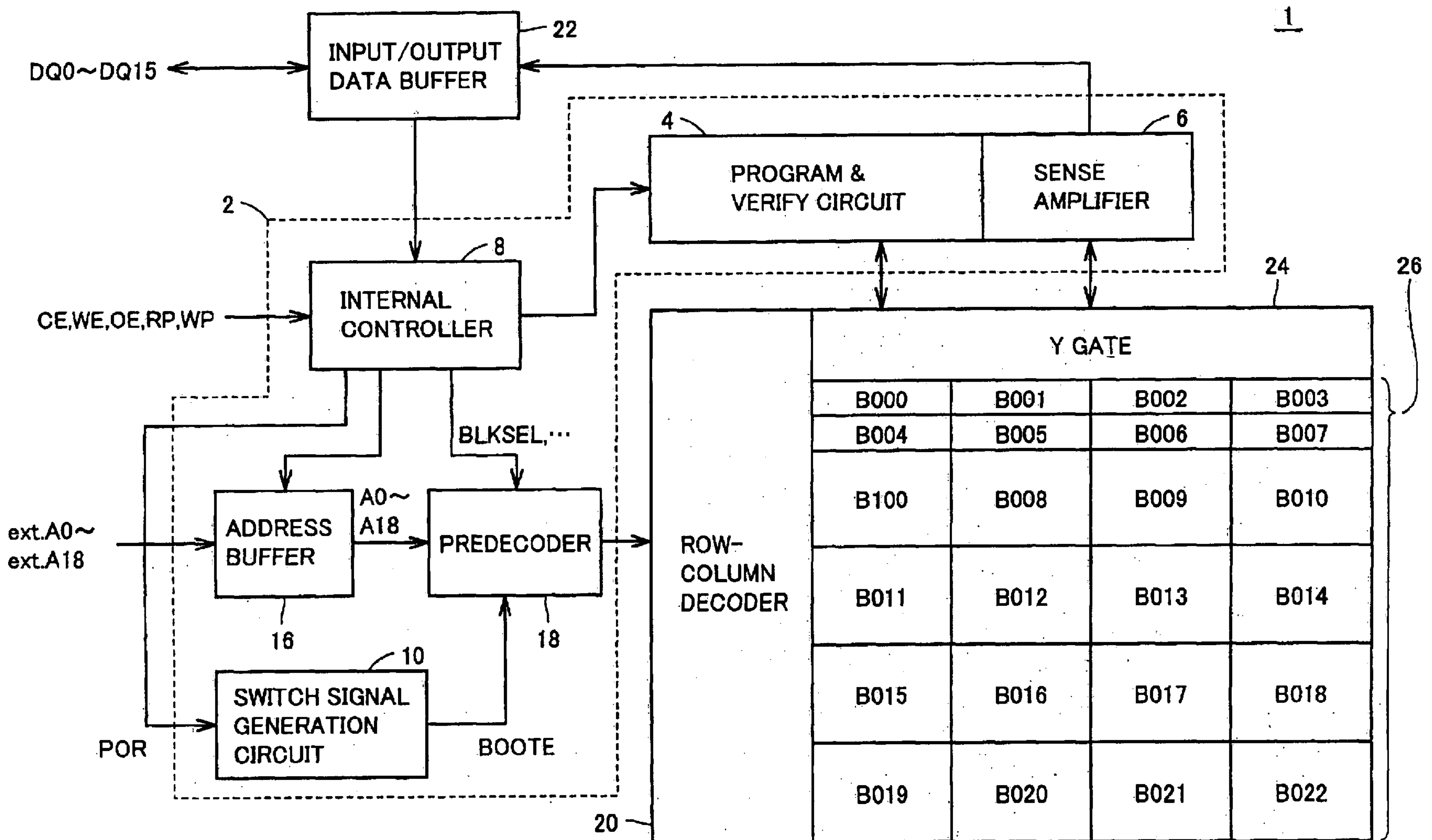
FIG. 1 is a schematic block diagram of a configuration of a non-volatile semiconductor device according to a first embodiment of the present invention.

Embodiments of the present invention will be described hereinafter with reference to the drawings. In the drawings, the same reference characters denote the same or corresponding elements.

First Embodiment

FIG. 1 is a schematic block diagram of a configuration of a non-volatile semiconductor memory device according to a first embodiment of the present invention.

Referring to FIG. 1, a non-volatile semiconductor memory device 1 includes an input/output data buffer 22, a control unit 2 providing control of programming, reading and erasure, a row-column decoder 20, a Y gate 24, and a memory array 26.

Input/output data buffer 22 receives externally applied signals DQ0–DQ15 in a programming mode and outputs signals DQ0–DQ15 from the chip in a read out mode.

Control unit 2 includes a program & verify circuit 4, a sense amplifier 6, an internal controller 8, an address buffer 16, a predecoder 18, and a switch signal generation circuit 10. Internal controller 8 receives a control signal such as externally applied signals CE, WE, OE, RP, WP and the like to acknowledge an externally applied designation to control address buffer 16, predecoder 18 and program & verify circuit 4. Internal controller 8 conducts reset cancel after a power on reset signal POR output to switch signal generation circuit 10 when the chip is powered on is rendered active for a predetermined time.

Switch signal generation circuit 10 outputs a signal BOOTE in accordance with a predetermined setting. Address buffer 16 receives address bits ext.A0-ext.A18 of an externally applied address signal to output address bits A0–A18 to predecoder 18. Predecoder 18 has its operation switched by a control signal such as a signal BLKSEL applied from internal controller 8 and signal BOOTE applied from switch signal generation circuit 10 to alter the decoded result of address bits A0–A18. Predecoder 18 outputs the decoded result to row-column decoder 20.

Memory array 26 includes memory blocks B000–B007 each having a storage capacity of 4 k words, and memory blocks B008–B022 and B100, each having a storage capacity of 32 k words. Although memory block B100 is generally a region not used, memory block B100 has a configuration similar to that of memory blocks B008–B022 to maintain the pattern continuity for the sake of convenience in memory array fabrication.

Blocks B000–B007 are a boot block and parameter block having a storage capacity smaller than that of a general block. When a boot block is not required, signal BOOTE is set at an L level through bonding option and the like. When signal BLKSEL attains an H level in an erasure operation, control unit 2 selects simultaneously four blocks aligned in the horizontal direction. At the same time, control unit 2 also selects two blocks in the vertical direction. As a result, eight blocks, i.e., B000–B007, are selected. The boot block and parameter block can be collectively subjected to erasure as one block having a capacity similar to that of a normal block.

Figure 2:
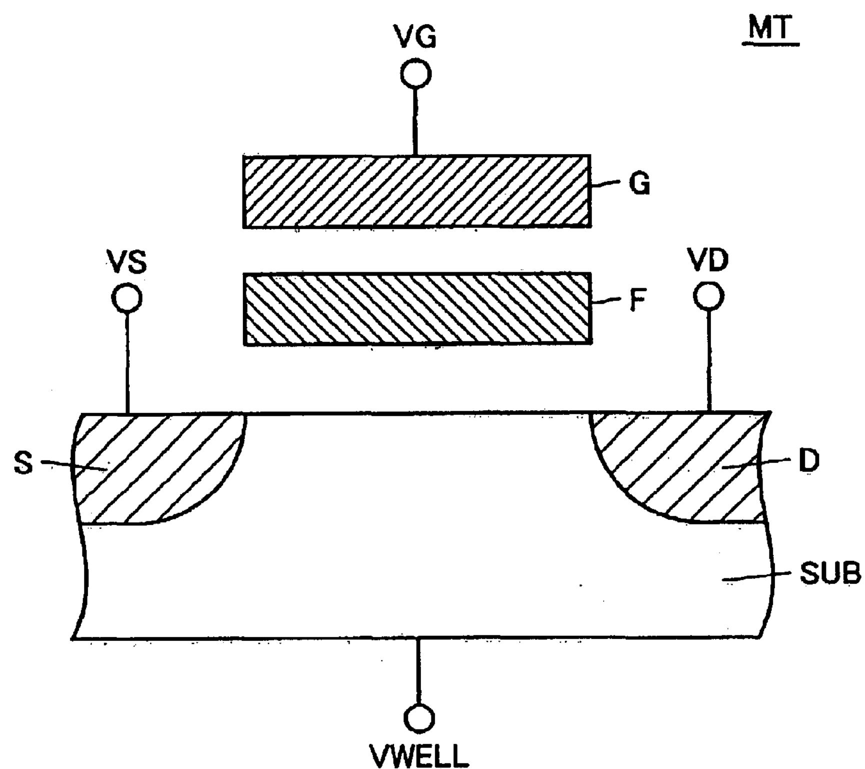
FIG. 2 is a sectional view of a memory transistor MT arranged in rows and columns in each memory block of a memory array 26.

FIG. 2 is a sectional view of a memory transistor MT arranged in rows and columns in each memory block of memory array 26.

Referring to FIG. 2, memory transistor MT includes a source S and a drain D which are impurity regions formed on a substrate SUB, a floating gate F formed upper to the region between source S and drain D, and a control gate G formed further upper to floating gate F.

The quantity of charge towards floating gate F of memory transistor MT can be altered by setting at a predetermined condition a voltage VG applied to control gate G, a voltage VS applied to source S, a voltage VD applied to drain D and a voltage VWELL applied to substrate SUB, whereby the threshold voltage of memory transistor MT is altered Accordingly, memory transistor MT can store the applied information through the value of the threshold voltage.

Figure 3:
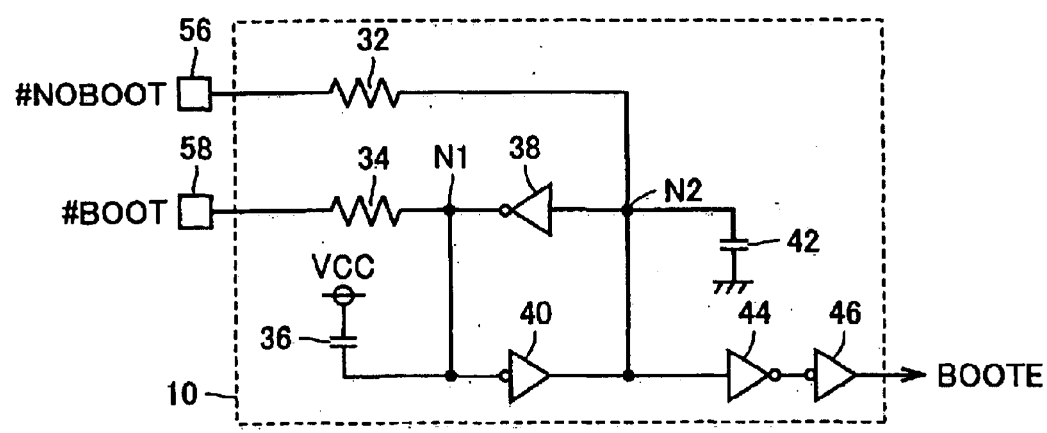
FIG. 3 is a circuit diagram of a configuration of a switch signal generation circuit 10 of FIG. 1.

FIG. 3 is a circuit diagram of a configuration of switch signal generation circuit 10 of FIG. 1.

Referring to FIG. 3, switch signal generation circuit 10 includes a resistor 32 connected between a pad 56 to which a signal #NOBOOT is applied and a node N2, a resistor 34 connected between a pad 58 to which a signal #BOOT is applied and a node N1, a capacitor 36 connected between node N1 and a node to which power supply potential VCC is applied, a capacitor 42 connected between node N2 and a ground node, an inverter 38 having its input connected to node N2 and its output connected to node N1, an inverter 40 having its input connected to node N1 and its output connected to node N2, an inverter 44 having its input connected to node N2, and an inverter 46 receiving and inverting the output of inverter 44 to output signal BOOTE.

Figures 4, 5:
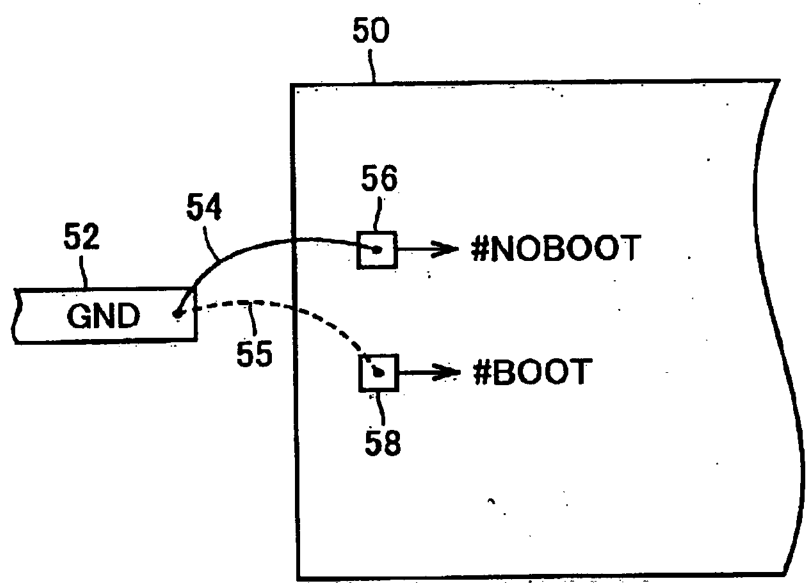
FIG. 4 is a diagram to describe a bonding option for the switch signal generation circuit of FIG. 3.
FIG. 5 is a diagram to describe the relationship of the set status of signals #NOBOOT and #BOOT and a signal BOOTE for switching.

FIG. 4 is a diagram to explain the bonding option with respect to the switch signal generation circuit of FIG. 3.

FIG. 5 is a diagram to describe the relationship between the set status of signals #NOBOOT and #BOOT and signal BOOTE for switching.

In the case where pad 56 to which signal #NOBOOT is applied is to be set to an L level, a lead 52 to which ground potential is applied among the plurality of leads around chip 50 is connected with pad 56 through a wire 54, as shown in FIG. 4. In this case, pad 58 is not connected to any lead, or connected through another wire with a lead to which power supply potential is applied. By such setting, signal BOOTE for switching is set at an L level.

When signal BOOTE is set at an L level, memory blocks B000–B007 of FIG. 1 can be erased collectively through one designation as one block having a storage capacity of 32 k words. In the case where a boot block is not required, the above-described bonding option is selected to reduce the time required for erasure. Non-volatile semiconductor memory devices are produced based on such selection.

In the case where lead 52 is connected with pad 58 through a wire 55 instead of the connection through wire 54, signal #BOOT is set at an L level. In this state, pad 56 may be connected to the lead to which power supply potential is applied through another wire, or be left unconnected. By such setting, signal BOOTE for switching is set at an H level.

Setting signal BOOTE at an H level corresponds to the case where a boot block is required. Each of memory blocks B000–B007 is handled as the basic unit of erasure.

Figure 6:
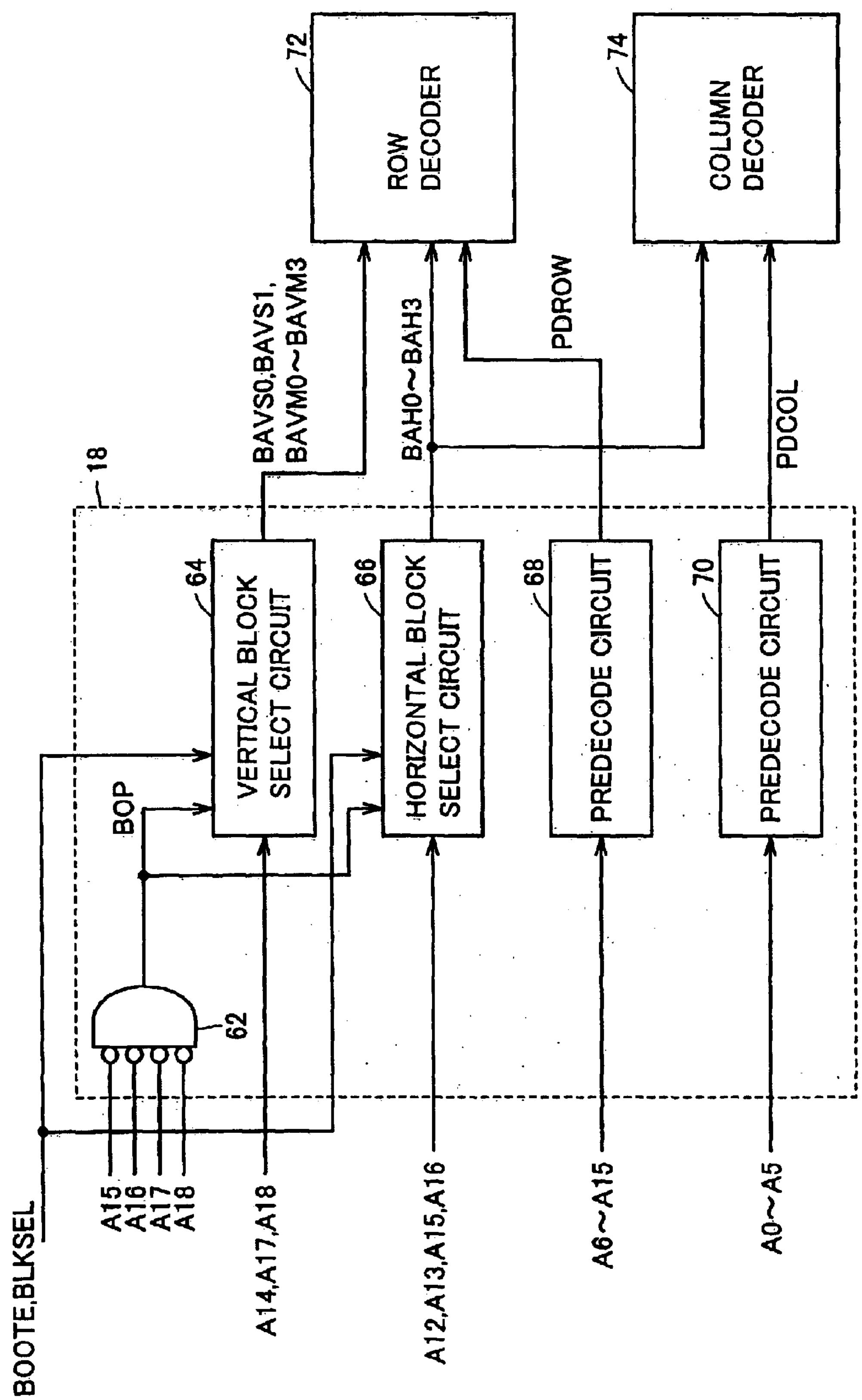
FIG. 6 is a block diagram to explain a configuration of a predecoder in FIG. 1.

FIG. 6 is a block diagram to describe a configuration of the predecoder in FIG. 1.

Referring to FIG. 6, predecoder 18 includes a 4-input NOR circuit 62 receiving address bits A15, A16, A17 and A18 to output a signal BOP, a vertical block select circuit 64 receiving signals BOOTE, BLKSEL and BOP as control signal to output signals BAVS0, BAVS1, and BAVM0–BAVM3 required to select a vertical block position in accordance with address bits A14, A17 and A18, a horizontal block select circuit 66 receiving signals BOOTE, BLKSEL and BOP as control signals to output signals BAH0–BAH3 required to select a horizontall block position based on address bits A12, A13, A15 and A16, a predecode circuit 68 receiving address bits A6–A15 to output a predecode signal PDROW related to row selection based on address bits A6–A15, and a predecode circuit 70 providing a predecode signal PDCOL related to column selection based on address bits A0–A5.

Row decoder 72 conducts row selection based on signals BAVS0, BAVS1, BAVM0–BAVM3, signals BAH0–BAH3, and predecode signal PDROW. Column decoder 74 conducts column selection based on signals BAH0–BAH3 and predecode signal PDCOL.

Signal BOOTE applied as a control signal is generated by select signal generation circuit 10 of FIG. 1. Signal BOOTE is set at an H level when a boot block of 4 k words is required. Signal BLKSEL is output from internal controller 8 of FIG. 1 to control the simultaneous select operation of a plurality of blocks.

Figure 7:
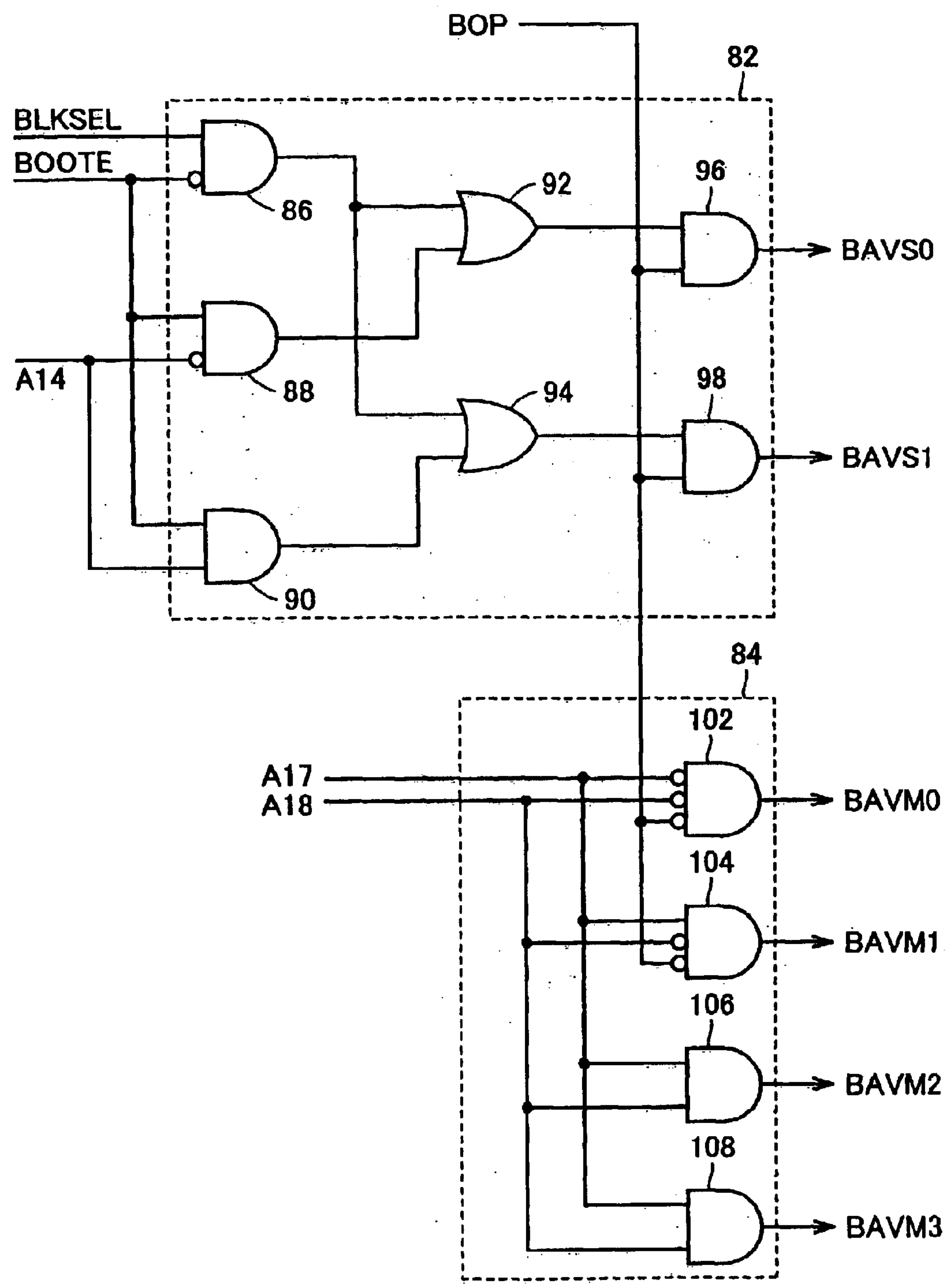
FIG. 7 is a circuit diagram to describe a configuration of a vertical block select circuit in FIG. 6.

FIG. 7 is a circuit diagram to describe a configuration of the vertical block select circuit of FIG. 6.

Referring to FIG. 7, vertical block select circuit 64 includes an address decode unit 82 providing signals BAVS0 and BAVS1 in accordance with address bit A14, and an address decode unit 84 providing signals BAVM0–BAVM3 in accordance with address bits A17 and A18.

Address decode unit 82 includes a gate circuit 86 providing a signal of an H level when signal BLKSEL is at an H level and signal BOOTE is at an L level, and providing a signal of an L level otherwise, a gate circuit 88 providing a signal of an H level when signal BOOTE is at an H level and address bit A14 is at an L level, and providing a signal of an L level otherwise, and an AND circuit 90 receiving signal BOOTE and address bit A14.

Address decode unit 82 further includes an OR circuit 92 receiving the outputs of gate circuits 86 and 88, an OR circuit 94 receiving the output of gate circuit 86 and the output of AND circuit 90, an AND circuit 96 receiving the output of OR circuit 92 and signal BOP to output a signal BAVS0, and an AND circuit 98 receiving the output of OR circuit 94 and signal BOP to output a signal BAVS1.

Address decode unit 84 includes a 3-input NOR circuit 102 receiving signal BOP and address bits A17 and A18 to output signal BAVM0, a gate circuit 104 rendered active when signal BOP is at an L level to render signal BAVM1 active when address bit A17 is at an H level and address bit A18 is at an L level, a gate circuit 106 rendering signal BAVM2 active when address bit A17 is at an L level and address bit A18 is at an H level, and an AND circuit 108 receiving address bits A17 and A18 to output signal BAVM3.

The reason why signal BOP is not applied to gate circuit 106 and AND circuit 108 is that, when address bit A18 is at an H level, signal BOP is set at an L level by NOR circuit 62 of FIG. 6. It is not necessary to input signal BOP.

In the case where signal BOOTE is at an H level, the operation of vertical block select circuit 64 is completely identical to that of a conventional vertical block select circuit. The operation of vertical block select circuit 64 is also completely identical to that of a conventional vertical block select circuit also in the case where signal BOOTE is at an L level and signal BLKSEL is at an L level.

In the case where signal BOOTE is at an L level and signal BLKSEL is at an H level, signals BAVS0 and BAVS1 both attain an H level regardless of whether address bit A14 is at an L level or an H level. Simultaneous selection of two blocks in the vertical direction is effected.

Figure 8:
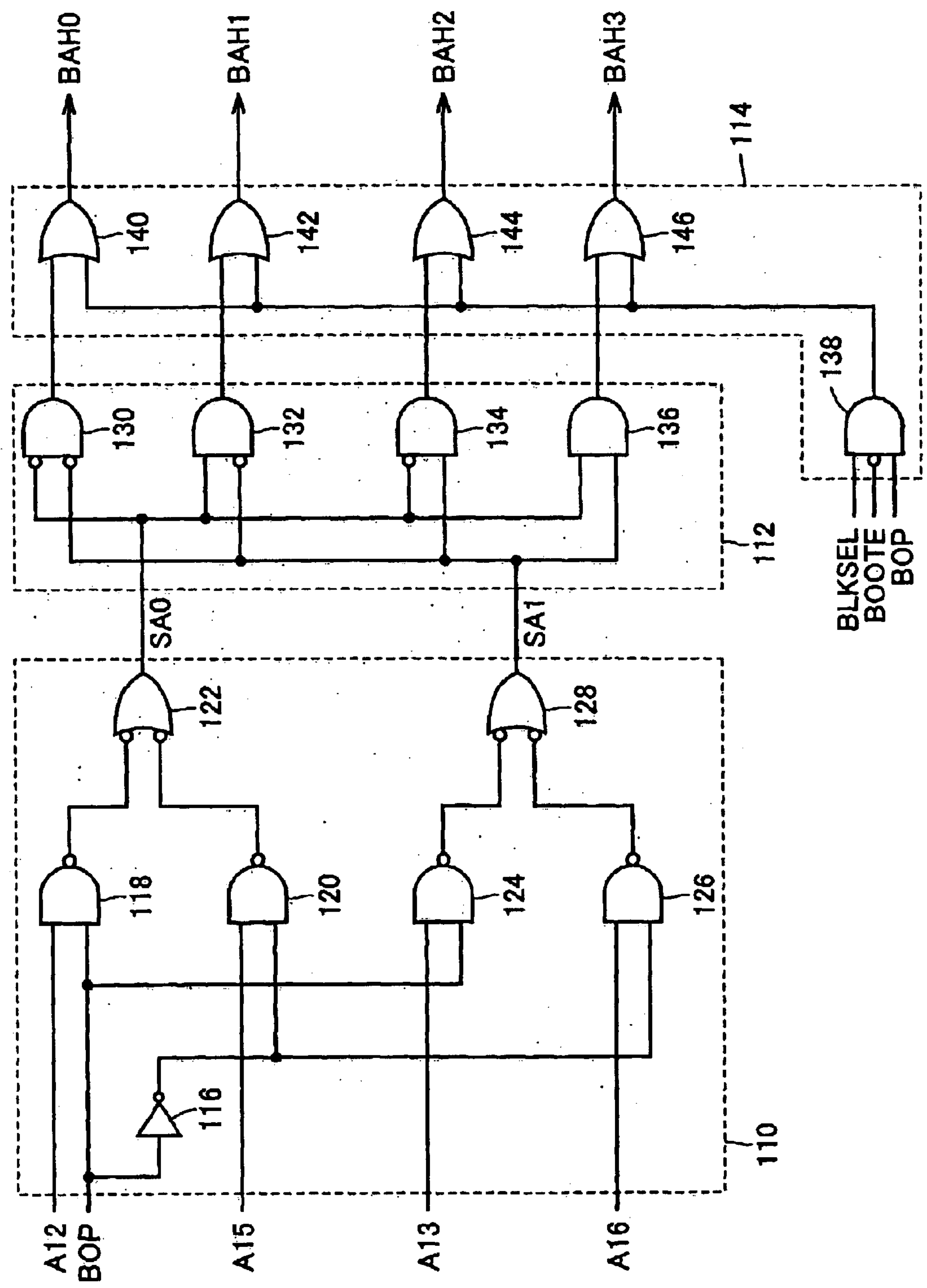
FIG. 8 is a circuit diagram of a configuration of a horizontal block select circuit in FIG. 6.

FIG. 8 is a circuit diagram of a configuration of a horizontal block select circuit of FIG. 6.

Referring to FIG. 8, horizontal block select circuit 66 includes an address select unit 110 determining whether to select address bits A12 and A13 as select address bits SA0 and SA1 or address bits A15 and A16 as select address bits SA0 and SA1 in accordance with signal BOP, an address decode unit 112 decoding select address bits SA0 and SA1, and an output unit 114 determining whether to render valid or not the output of address decode unit 112.

Address select unit 110 includes an inverter 116 receiving and inverting signal BOP, a NAND circuit 118 receiving address bit A12 and signal BOP, a NAND circuit 120 receiving address bit A15 and the output of inverter 116, and a NAND circuit 122 receiving the outputs of NAND circuits 118 and 120 to output a select address bit SA0.

Address select unit 110 further includes a NAND circuit 124 receiving address bit A13 and signal BOP, a NAND circuit 126 receiving address bit A16 and the output of inverter 116, and a NAND circuit 128 receiving the outputs of NAND circuits 124 and 126 to output select address bit SA1.

Address decode unit 112 includes a decode gate circuit 130 detecting the case where select address bits SA0 and SA1 are both at an L level, a decode gate circuit 132 detecting the case where select address bit SA0 is at an H level and select address bit SA1 is at an L level, a decode gate circuit 134 detecting that select address bit SA0 is at an L level and select address bit SA1 is at an H level, and a decode gate circuit 136 detecting that select address bits SA0 and SA1 are both at an H level.

Output unit 114 includes a gate circuit 138 detecting that signals BLKSEL and BOP are both at an H level and signal BOOTE is at an L level, an OR circuit 140 receiving the output of gate circuit 138 and the output of decode gate circuit 130 to output signal BAH0, an OR circuit 142 receiving the outputs of gate circuit 138 and decode gate circuit 132 to output signal BAH1, an OR circuit 144 receiving the outputs of gate circuit 138 and decode gate circuit 134 to output signal BAH2, and an OR circuit 146 receiving the outputs of gate circuit 138 and decode gate circuit 136 to output signal BAH3.

In the case where signal BOOTE is at an H level, the operation of horizontal block select circuit 66 of FIG. 8 is completely identical to that of a conventional horizontal block select circuit. The operation of horizontal block select circuit 66 is also completely identical to that of a conventional horizontal block select circuit also in the case where signal BOOTE is at an L level and signal BLKSEL is at an L level.

In the case where signal BOOTE is at an L level and signal BLKSEL is at an H level, signals BAH0, BAH1, BAH2 and BAH3 all attain an H level to allow simultaneous selection of 4 blocks aligned in the horizontal direction, irrespective of whether address bits A12 and A13 are at an L level or an H level. At this stage, signals BAVS0 and BAVS1 both attain an H level to allow simultaneous selection of two blocks in the vertical direction, irrespective of whether address bit A14 is at an L level or an H level in the vertical block select circuit of FIG. 7. As a result, eight blocks, i.e., blocks B000–B007, are selected.

Figure 9:
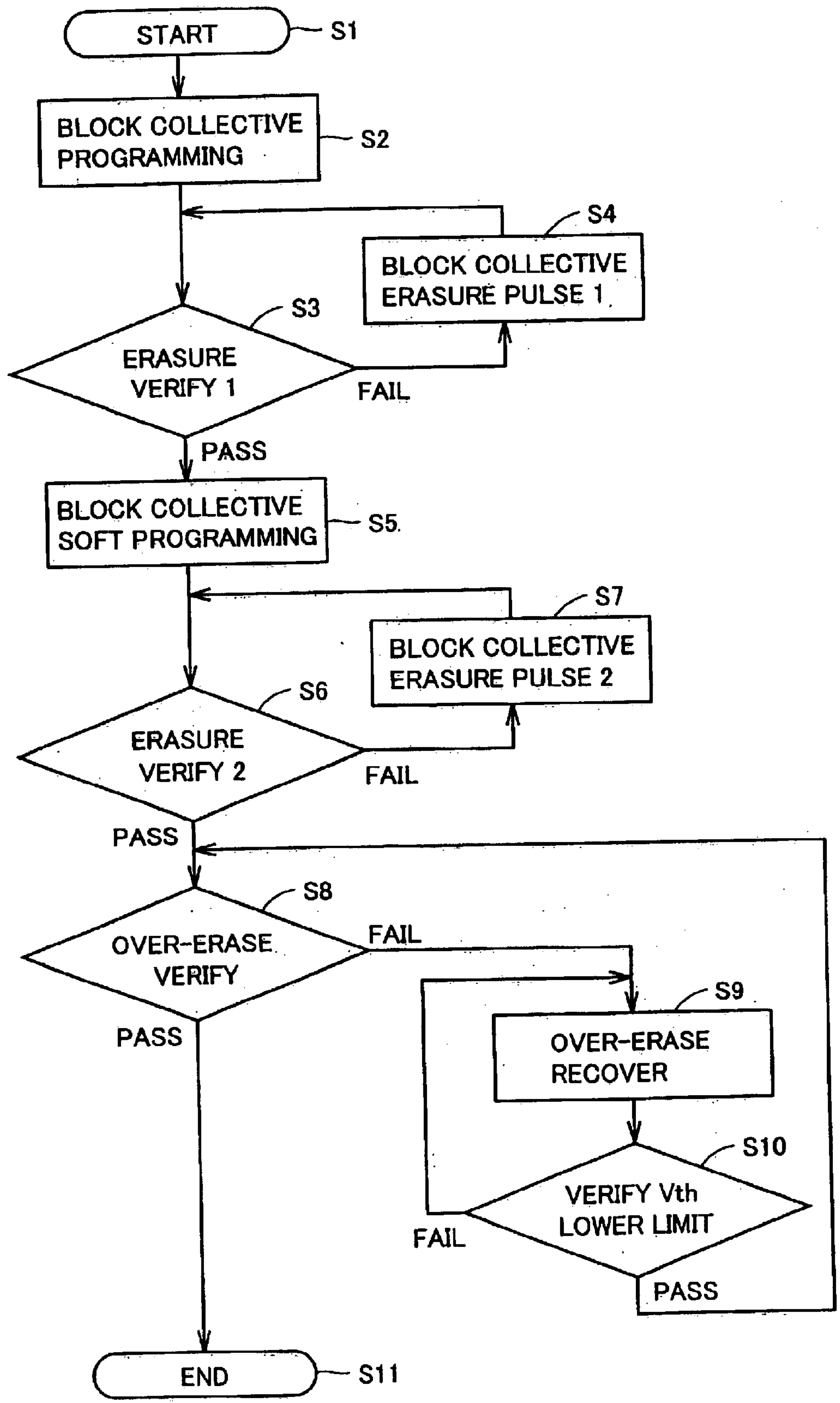
FIG. 9 is a flow chart to explain an operation flow of the internal controller of FIG. 1 in a block erasure mode.

FIG. 9 is a flow chart to explain an operation of the internal controller of FIG. 1 in a block erasure mode.

An erasure operation in a block-by-block basis characteristic to the flash memory of the present invention according to the first embodiment will be described with reference to FIG. 9.

A flash memory is characterized in that collective erasure of blocks can be implemented. In the erasure operation flow, the pulse is applied collectively to all the memory cells in the entire block at step S2 corresponding to block collective programming, at step S4 corresponding to application of block collective erasure pulse 1, at step S5 corresponding to block collective soft programming, and at step S7 corresponding to application of block collective erasure pulse 2. "Block collective soft programming" implies a weak collective programming operation having the pulse application time set shorter or the voltage of the applied pulse set lower than those of the programming operation executed at step S2.

In the execution of the four steps of S2, S4, S5 and S7 according to the present invention, the eight blocks B000–B007 of 4 k words can be selected simultaneously through vertical block select circuit 64 of FIG. 7 and horizontal block select circuit 66 of FIG. 8. In these four steps, the eight blocks of 4 k words can be handled as one main block (a 32 k-word block).

The sequence of the operation flow of FIG. 9 will be described hereinafter. In response to an externally applied address corresponding to an erasure command, an erasure operation is initiated at step S1. At step S2, the block that is the subject of erasure is designated to collective programming. Internal controller 8 sets signal BLKSEL at an H level at the time of execution of step S2. Since simultaneous selection of a plurality of blocks is to be conducted in response, memory blocks B000–B007 of FIG. 1 are selected simultaneously to have a programming pulse applied collectively in the case where the setting is based on non-usage of 4 k words.

Signal BLKSEL is set at an H level only in the step where a pulse is to be applied collectively to the memory cells of the erasure block. In other words, signal BLKSEL is set at an H level during execution of steps S4, S5 and S7 as well as step S2, and is set at an L level otherwise.

Control proceeds to step S3 where erasure verify 1 is conducted. Erasure verify 1 is an operation verifying whether the threshold voltage of the memory transistor of the specified memory block has attained a threshold voltage level corresponding to a predetermined erasure state. In the case where the threshold voltage has not arrived at a prescribed erasure state, the erasure verify operation indicates "fail". Control proceeds to step S4 where block collective erasure pulse is applied to the block subject to erasure. Upon completion of the application of an erasure pulse at step S4, control returns to step S3 to execute erasure verify 1.

When erasure verify 1 indicates "pass" at step S5, control proceeds to step S5 where block collective soft programming is executed. Then, control proceeds to step S6 where erasure verify 2 is executed. In the case where erasure verify 2 is not completed, control proceeds to step S7 where block collective erasure pulse 2 is applied to the selected block. Then, control proceeds to step S6 again where erasure verify 2 is executed.

When erasure verify 2 indicates "pass" at step S6, control proceeds to step S8 where an "over-erase verify" operation detecting an over erased state is conducted. "Over erased" corresponds to the case where application of an erasure pulse causes the threshold voltage of the memory transistor to be altered, exceeding a predetermined range.

In the case where over-erase verify indicates "fail" based on detection of "over erased", control proceeds to step S9 where an over-erase recover operation is conducted. At step S10, the lower limit value of threshold voltage Vth is verified. Control returns to step S9 if the result indicates "fail". When the verify result indicates "pass" at step S10, control returns to step S8 to execute over-erase verify again. When the result indicates "pass" at step S8, control proceeds to step S11 where a block erasure operation is completed.

[Modification of Switch Signal Generation Circuit]

Figures 10, 11:
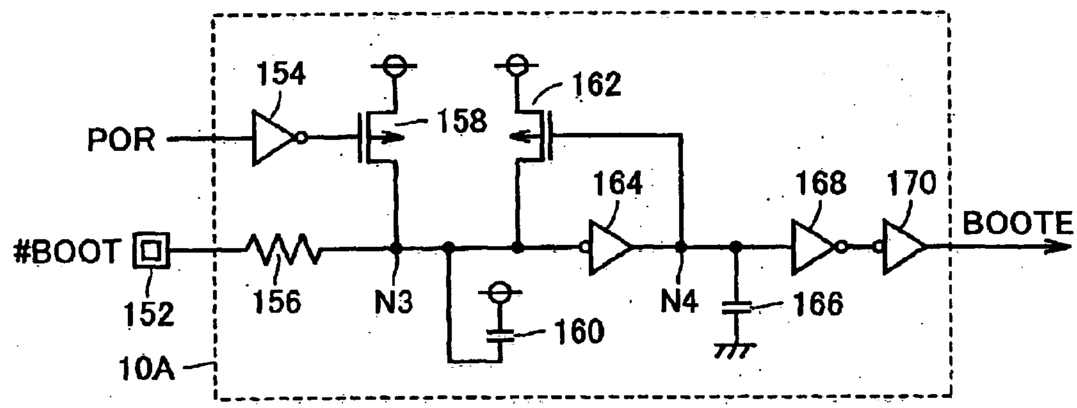
FIG. 10 is a circuit diagram of a switch signal generation circuit of FIG. 3 based on a first modification.
FIG. 11 is a diagram to describe the setting and output of the switch signal generation circuit of FIG. 10.

FIG. 10 is a circuit diagram of a switch signal generation circuit to describe a first modification of the switch signal generation circuit of FIG. 3.

Referring to FIG. 10, a switch signal generation circuit 10A includes a resistor 156 connected between a pad 152 to which signal #BOOT is applied and a node N3, an inverter 154 receiving and inverting a power on reset signal POR, a P channel MOS transistor 158 connected between a power supply node and node N3, receiving the output of inverter 154 at its gate, and a capacitor 160 connected between the power supply node and node N3.

Switch signal generation circuit 10A further includes an inverter 164 having its input connected to node N3 and its output connected to a node N4, a P channel MOS transistor 162 connected between the power supply node and node N3, and having its gate connected to node N4, a capacitor 166 connected between node N4 and a ground node, an inverter 168 having its input connected to node N4, and an inverter 170 receiving and inverting the output of inverter 168 to provide signal BOOTE.

FIG. 11 is a diagram to explain the setting and output of the switch signal generation circuit of FIG. 10.

In the case where pad 152 is connected to a lead to which ground potential is applied through wire bonding option, signal #BOOT is set at an L level. In response, signal BOOTE is set at an H level.

In the case where pad 152 is connected to a lead to which power supply potential is supplied through a wire, or attains an open state not connected to a lead, signal BOOTE is set at an L level. Switch signal generation circuit 10 may be modified as described here.

Figures 12, 13:
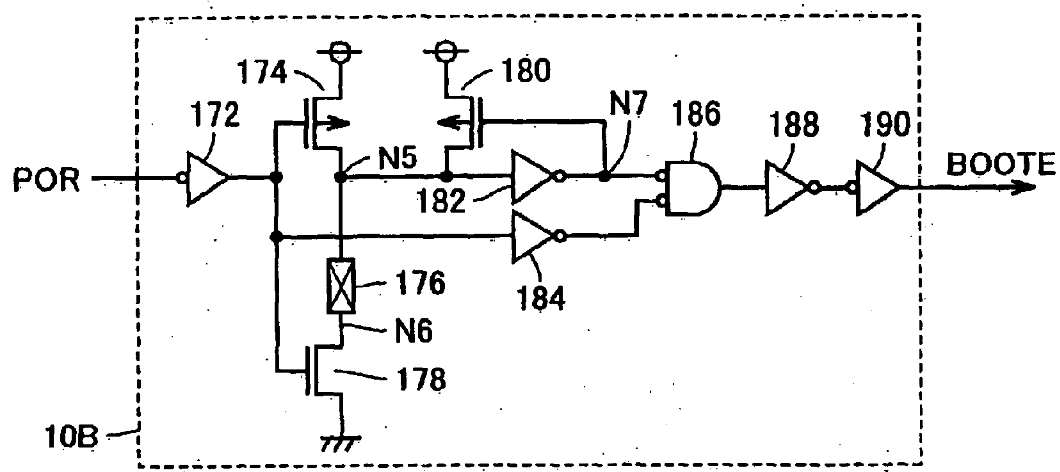
FIG. 12 is a circuit diagram of a switch signal generation circuit according to a second modification.
FIG. 13 is a diagram to explain the relationship between the status of a fuse element and a signal BOOTE for controlling switching.

FIG. 12 is a circuit diagram of a second modification of a switch signal generation circuit.

Referring to FIG. 12, a switch signal generation circuit 10B includes an inverter 172 receiving and inverting power on reset signal POR, a P channel MOS transistor 174 connected between the power supply node and a node N5, receiving the output of inverter 172 at its gate, a fuse element 176 connected between nodes N5 and N6, burnable by a laser beam, and an N channel MOS transistor 178 connected between a node N6 and the ground node, receiving the output of inverter 172 at its gate.

Switch circuit generation circuit 10B further includes an inverter 182 having its input connected to node N5 and its output connected to a node N7, a P channel MOS transistor 174 connected between the power supply node and node N5, having its gate connected to node N7, an inverter 184 receiving and inverting the output of inverter 172, a NOR circuit 186 receiving the outputs of inverters 182 and 184, an inverter 188 receiving and inverting the output of NOR circuit 186, and an inverter 190 receiving and inverting the output of inverter 188 to output signal BOOTE.

FIG. 13 is a diagram to explain the relationship between the state of the fuse element and signal BOOTE controlling switching.

When fuse element 176 is burned out by a laser beam, node N5 is maintained at an H level, and node N7 attains an L level. Following canceling of power on reset, the output of inverter 184 attains an L level. In response, signal BOOTE for switching control is set at an H level.

In the case where fuse element 176 attains a conducting state, canceling of power on reset causes node N5 to be set at an L level. As a result, node N7 is set at an H level. In response, the output of NOR circuit 186 attains an L level. Signal BOOTE for switching control is set at an L level.

Semiconductor memory devices of the non-volatile semiconductor memory device type often include the step of burning out a fuse element to replace a defective memory cell, when present, with a redundant memory cell. By burning out the fuse element of the switch signal generation circuit of the present embodiment in such a burn out step, the setting of the switch signal can be altered without having to provide an additional apparatus.

Figures 14, 15:
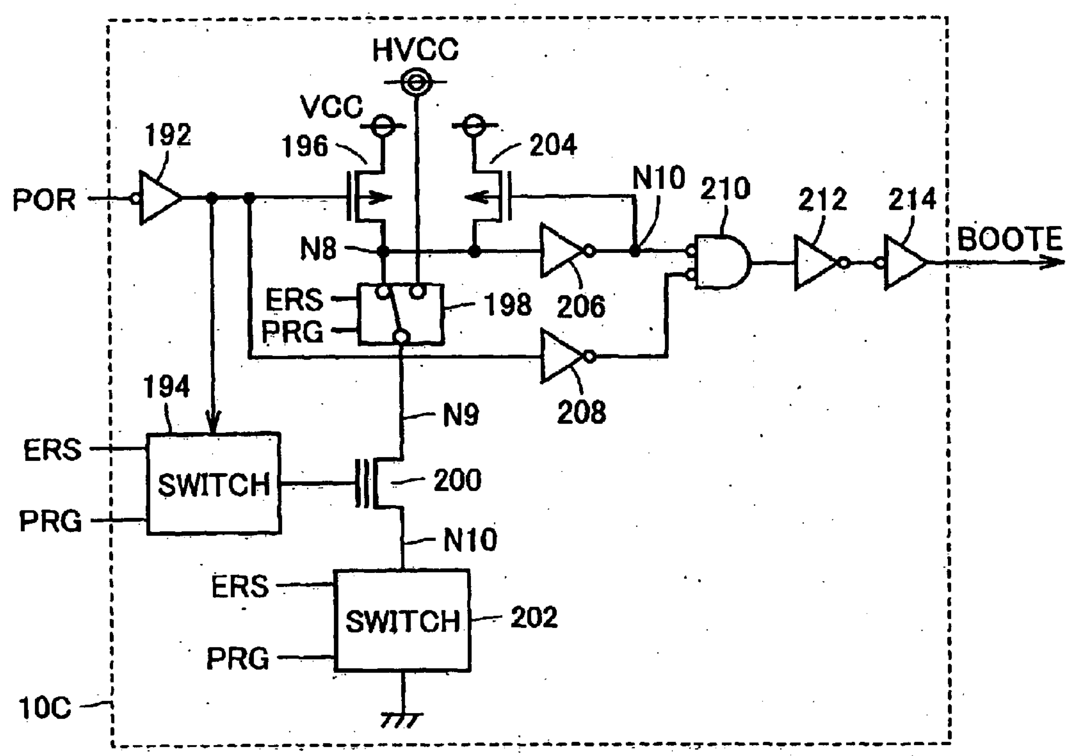
FIG. 14 is a circuit diagram of a switch signal generation circuit according to a third modification.
FIG. 15 is a diagram showing the relationship between a threshold voltage set at a memory transistor in the switch signal generation circuit of FIG. 14 and signal BOOTE.

FIG. 14 is a circuit diagram of a switching signal generation circuit based on a third modification.

Referring to FIG. 14, a switching signal generation circuit 10C includes an inverter 192 receiving and inverting power on reset signal POR, a P channel MOS transistor 196 connected between the power supply node and a node N8, receiving the output of inverter 192 at its gate, a switch 198 selectively coupling node N8 and a power potential HVCC higher than the general power supply potential with a node N9, a memory transistor 200 connected between nodes N9 and N10, a switch 202 connected between node N10 and the ground node, and a switch 194 to control the control gate of memory transistor 200.

Memory transistor 200 has a configuration similar to that of a memory transistor included in the memory array of the non-volatile semiconductor memory device of the present invention. Therefore, a memory transistor 200 can be provided in switch signal generation circuit 10C by modifying the pattern design without having to add a new step.

Switches 198, 194 and 202 are provided to control nodes N9 and N10 and the control gate of memory transistor 200 in accordance with an erasure command and program command in a predetermined test mode. In this predetermined test mode, the content to be held by the floating gate of memory transistor 200 is set.

Following the setting of the storage information in memory transistor 200, switch 194 provides the output of inverter 192 to the control gate of memory transistor 200. Switch 198 establishes connection between nodes N8 and N9. Switch 202 establishes connection between node N10 and the ground node.

Select signal generation circuit 10C further includes an inverter 206 having its input connected to node N8 and its output connected to node N10, a P channel MOS transistor 204 connected between the power supply node and node N8, having its gate connected to node N10, an inverter 208 receiving and inverting the output of inverter 192, a NOR circuit 210 receiving the outputs of inverters 206 and 208, an inverter 212 receiving and inverting the output of NOR circuit 210, and an inverter 214 receiving and inverting the output of inverter 212 to output signal BOOTE.

FIG. 15 shows the relationship between the threshold voltage set at the memory transistor of the switching signal generation circuit of FIG. 14 and signal BOOTE.

When threshold voltage Vth of memory transistor 200 is higher than a predetermined voltage, memory transistor 200 attains a non-conductive state even if the output of inverter 192 is rendered active. This is equivalent to the state of fuse element 176 of FIG. 12 being burned out. Therefore, signal BOOTE is set at an H level.

In the case where threshold voltage Vth of memory transistor 200 is lower than a predetermined level, memory transistor 200 is rendered conductive when the output of inverter 192 attains an H level, whereby node N9 is connected to node N10. This is equivalent to the case where fuse element 176 conducts in the circuit of FIG. 12. Therefore, signal BOOTE is set at an L level.

Since a process flow of fabricating a non-volatile memory cell is applied in the present invention, a switch signal can be generated appropriately without having to add a fabrication step even if a memory transistor similar to that of a non-volatile memory cell is employed to set signal BOOTE.

[Modification of First Embodiment]

The above-described embodiment was based on a configuration in which a plurality of blocks are erased at the same time through one designation by selecting a plurality of blocks simultaneously at the time of applying a prescribed pulse in predecoder 18 of FIG. 1. An operation can be executed similarly when viewed from outside by causing the internal controller to erase a plurality of blocks sequentially in accordance with one externally applied designation.

Figure 16:
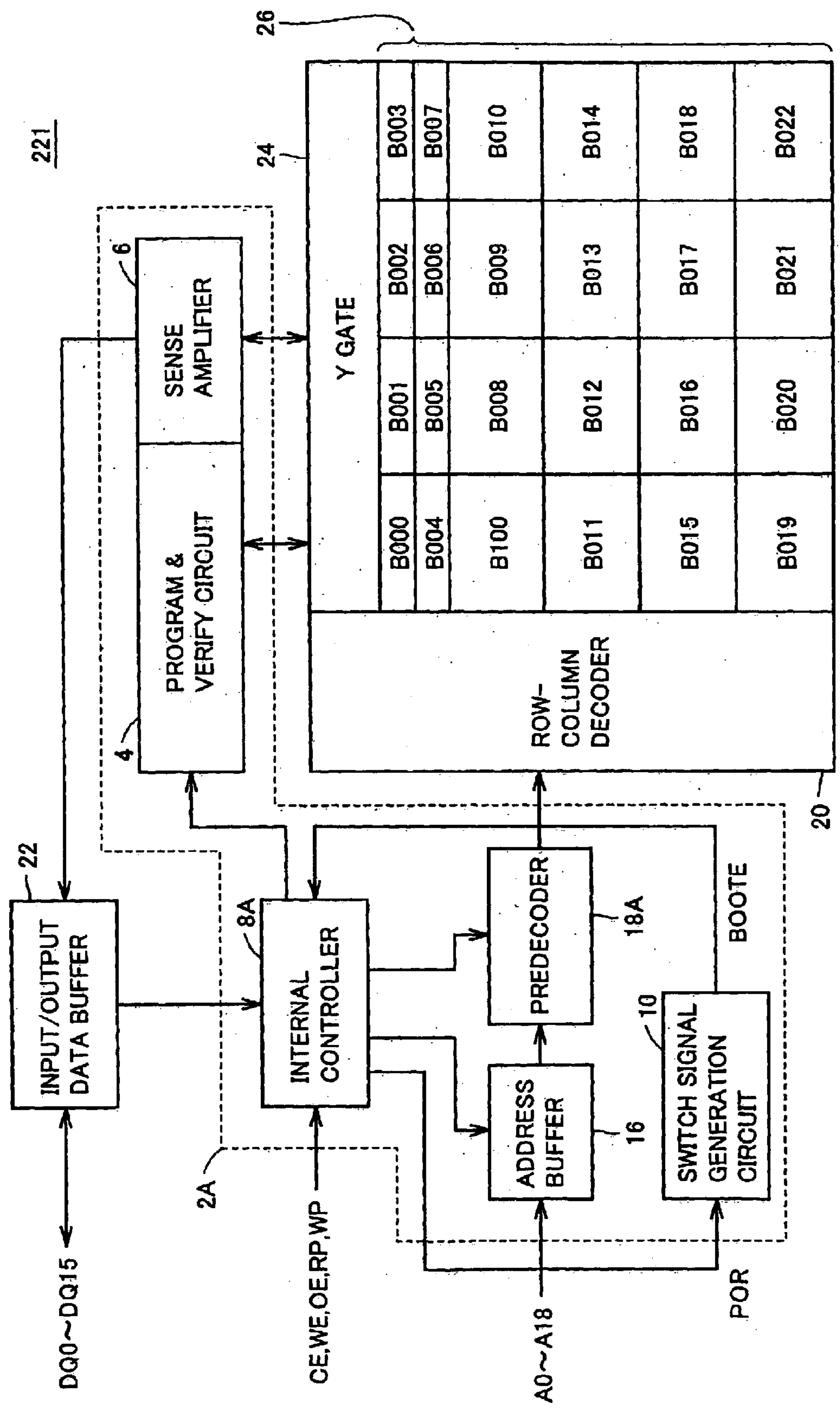
FIG. 16 is a block diagram to explain a configuration of a non-volatile semiconductor memory device in accordance with a modification of the first embodiment.

FIG. 16 is a block diagram to explain a configuration of a non-volatile semiconductor device according to a modification of the first embodiment.

Referring to FIG. 16, a non-volatile semiconductor memory device 221 includes a control unit 2A instead of control unit 2, based on the structure of non-volatile semiconductor memory device 1 described with reference to FIG. 1. Control unit 2A includes an internal controller 8A and a predecoder 18A instead of internal controller 8 and predecoder 18, respectively, in the configuration of control unit 2 of FIG. 1. The remaining structure of non-volatile semiconductor memory device 221 is similar to that of non-volatile semiconductor memory device 1 of FIG. 1. Therefore, similar description will not be repeated.

Figure 27:
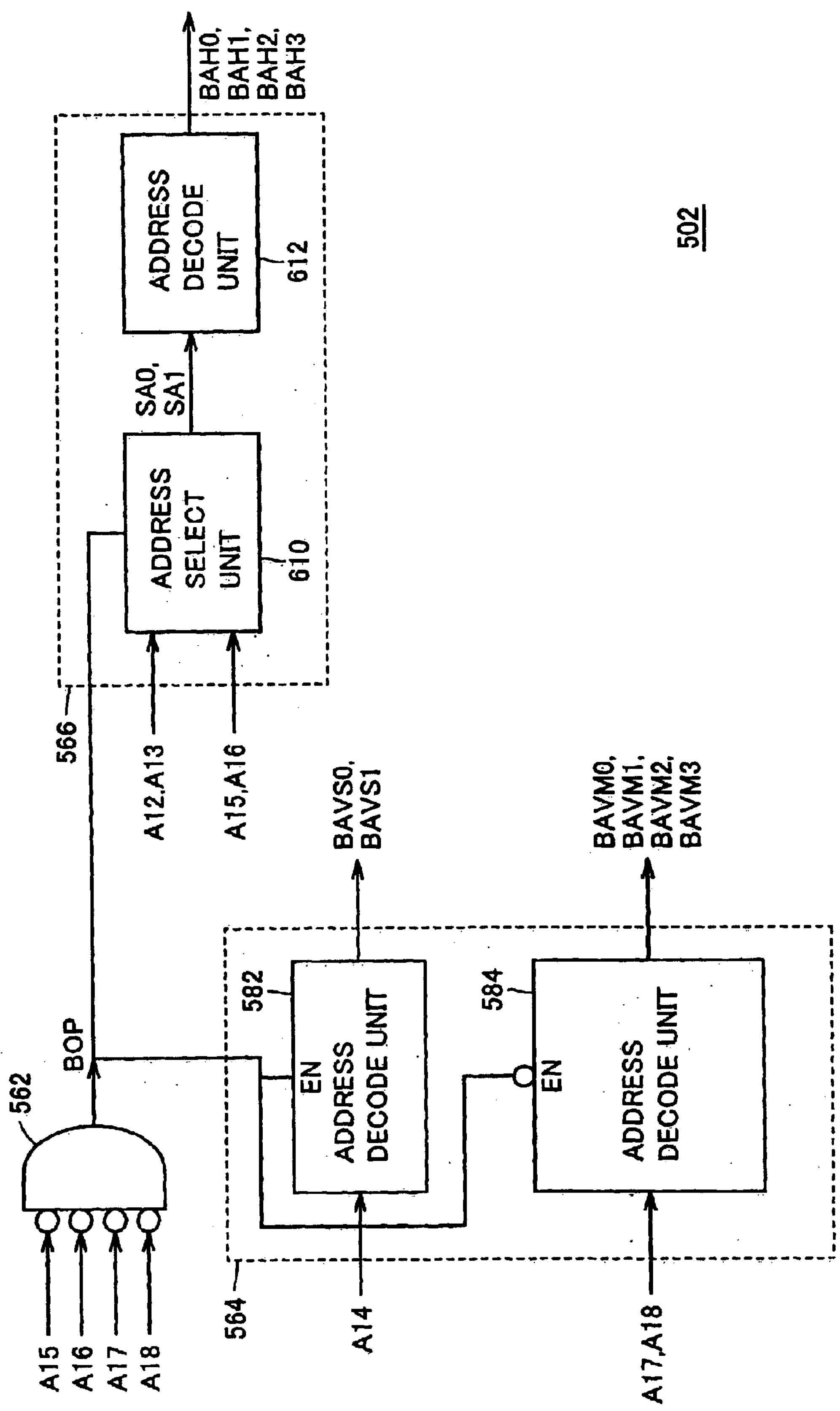
FIG. 27 is a block diagram of a configuration of a conventional block select decoder generating a select signal of a memory block.
Figure 28:
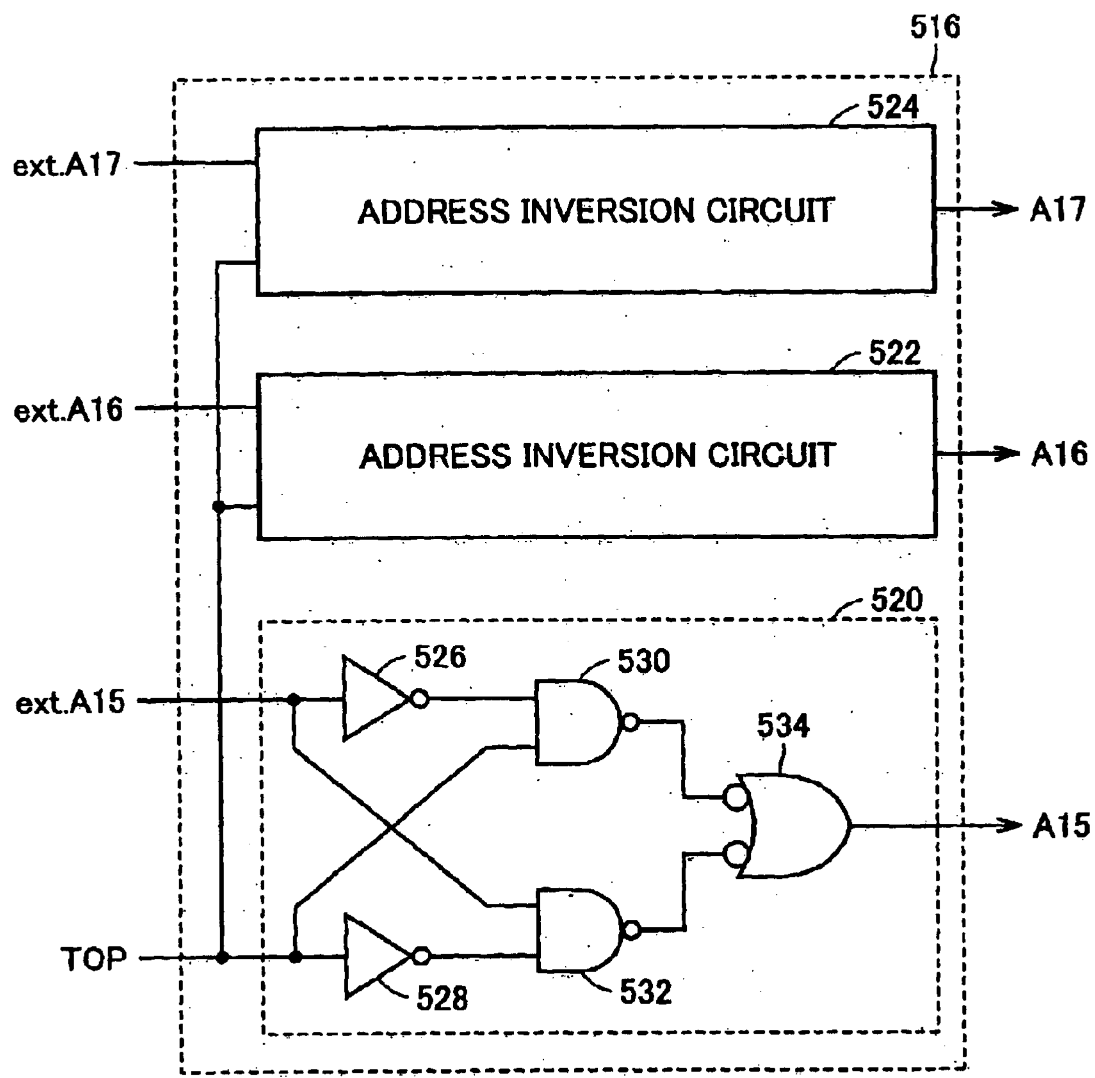
FIG. 28 is a circuit diagram of a configuration of a conventional address input buffer 516.
Figure 29:
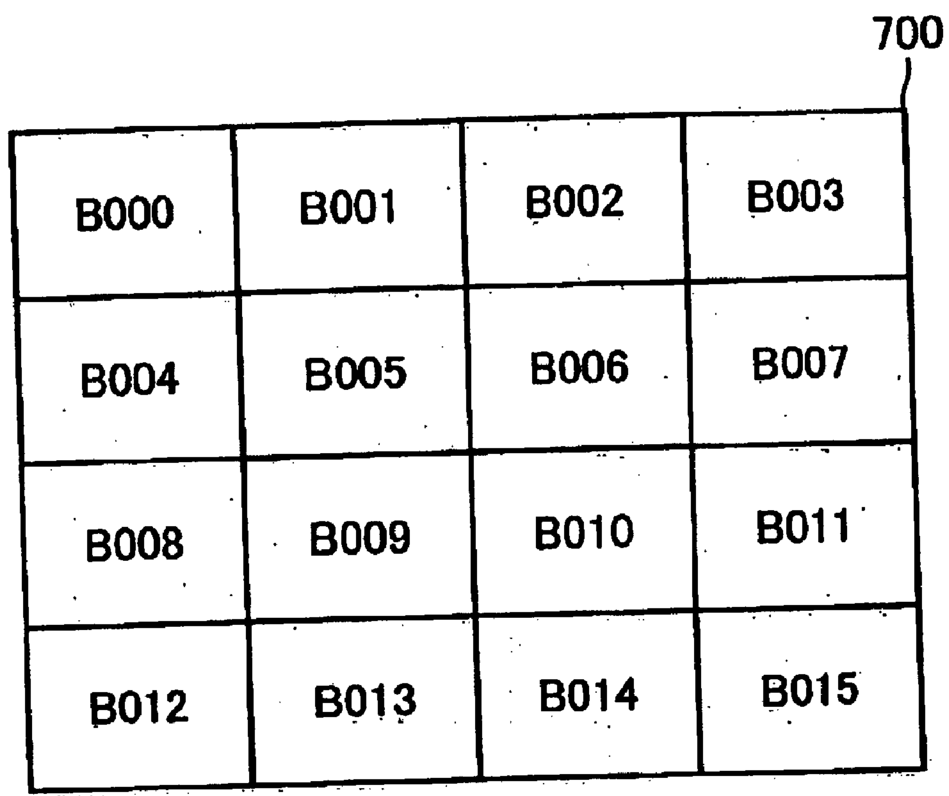
FIG. 29 is a diagram of an array configuration of another conventional flash memory.

Predecoder 18A carries out an operation similar to that of a conventional block select operation described with reference to FIG. 27.

Figure 17:
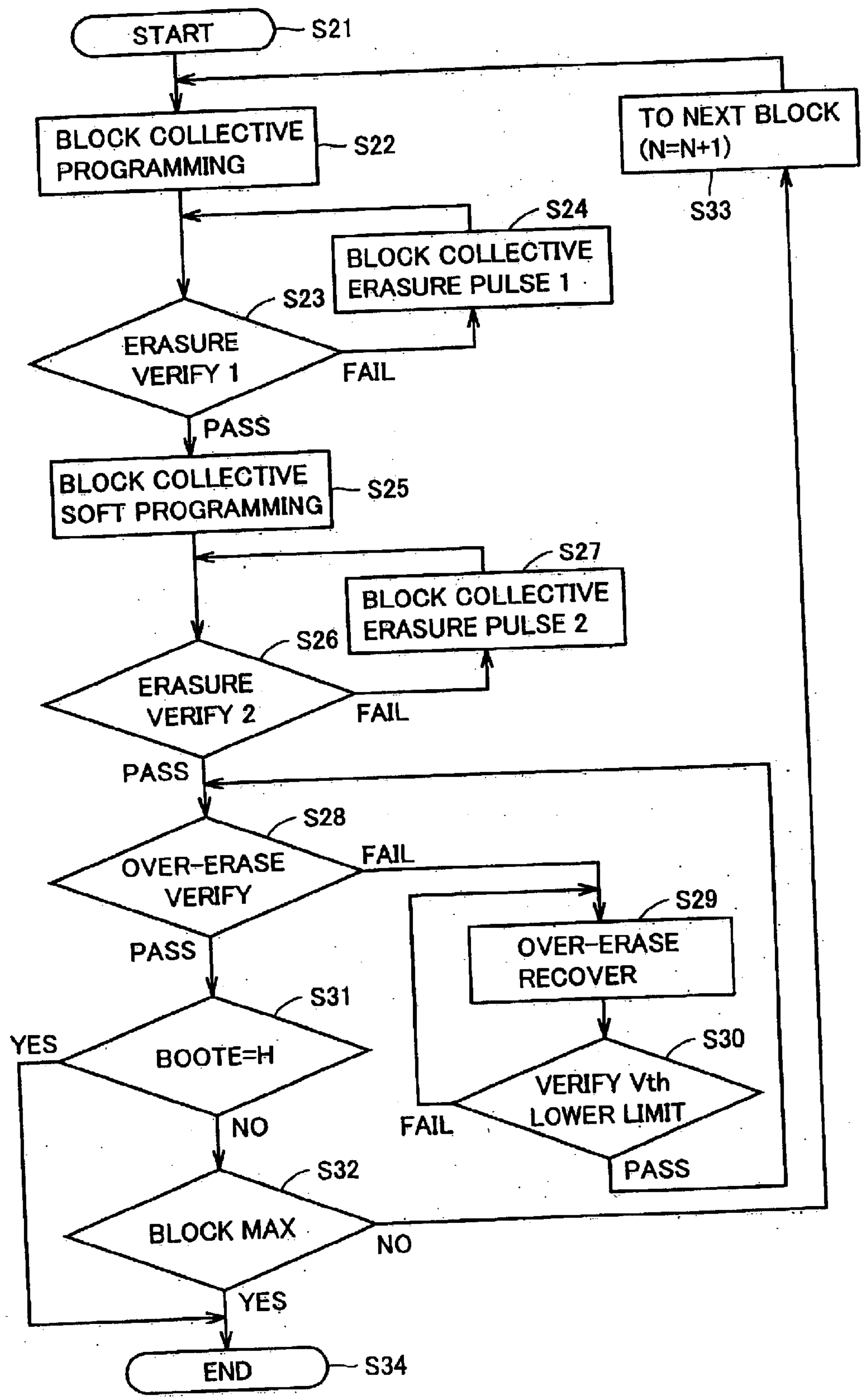
FIG. 17 is a flow chart to describe an erasure operation of the internal controller of FIG. 16.

FIG. 17 is a flow chart to describe an erasure operation of the internal controller of FIG. 16.

Referring to FIG. 17, internal controller 8A initiates an erasure operation at step S21 upon receiving erasure designation of a predetermined block through an externally applied control signal.

At step S22, the block subject to erasure is designated to collective programming. Then, control proceeds to step S23 where erasure verify 1 is executed. Erasure verify 1 is an operation verifying whether the threshold voltage of the memory transistor of a specified memory block attains a threshold voltage level corresponding to a predetermined erasure state. The erasure verify indicates "fail" when the threshold voltage has not attained a prescribed erasure state. Control proceeds to step S24 where block collective erasure pulse is applied to the block subject to erasure. Upon completion of application of an erasure pulse at step S24, control returns to step S23 where erasure verily 1 is executed.

When erasure verify 1 indicates "pass" at step S23, control proceeds to step S25 where block collective soft programming is executed. Then, control proceeds to step S25 where erasure verify 2 is executed. When erasure verify 2 is not completed, control proceeds to step S27 where block collective erasure pulse 2 is applied to the selected block. Then, control returns to step S26 where erasure verify 2 is executed again.

When erasure verify 2 indicates "pass" at step S26, control proceeds to step S28 where over-erase verify detecting an over erased state is carried out.

When over-erase verify indicates "fail" upon detecting "over erased", control proceeds to step S29 where an over-erase recover operation is conducted. At step S30, the lower limit value of threshold voltage Vth is verified. If this result indicates "fail", control returns to step S29.

When the verify result indicates "pass" at step S30, control returns to step S28 to carry out the over-erase verify operation again. When the result indicates "pass", at step S28, control proceeds to step S31.

At step S31, signal BOOTE generated at the switch signal generation unit is checked. Signal BOOTE of an H level implies that a boot block is required. Therefore, only the first specified block is erased. Control proceeds to step S34 where the erasure operation ends.

In contrast, signal BOOTE of an L level implies that a boot block is not required. Blocks B000–B007 of 4 k words become the subject of collective erasure. Therefore, control proceeds to step S32 to determine whether the currently erased block is the last of the blocks subject to collective erasure.

When the current erased block is not the last block, control proceeds to step S33 where the next block is set as the block to be erased. For example, in the case where the currently erased block is block B000, the next block B001 is set as the subject of erasure. Then, control proceeds to step S22 to execute collective erasure of the block of interest.

When determination is made that the block is the last block at step S32, i.e. when sequential erasure proceeds from block B000 and the current erased block is block B007, control proceeds to step S34. In the case where the currently erased block is not a block of 4 k words, i.e. when the currently erased block is blocks B008–B022, control proceeds to step S34 where the erasure operation is completed.

Thus, a sequence of erasing a plurality of blocks one block at a time in accordance with one erasure designation can be incorporated into a controller instead of selecting a plurality of blocks simultaneously.

Second Embodiment

The previous first embodiment is directed to a non-volatile memory that can switch between an operation of erasing memory blocks B000–B007 of 4 k words of FIG. 1 individually and an operation of erasing the memory blocks collectively through a predetermined setting. Memory block B100 that had to be provided for the sake of continuity of the memory array was a region that is always not used. In the case where a 4 k-word block is not required, the predecoder can be configured so as to select memory block B100 that was conventionally unused instead of memory blocks B000–B007.

Figure 18:
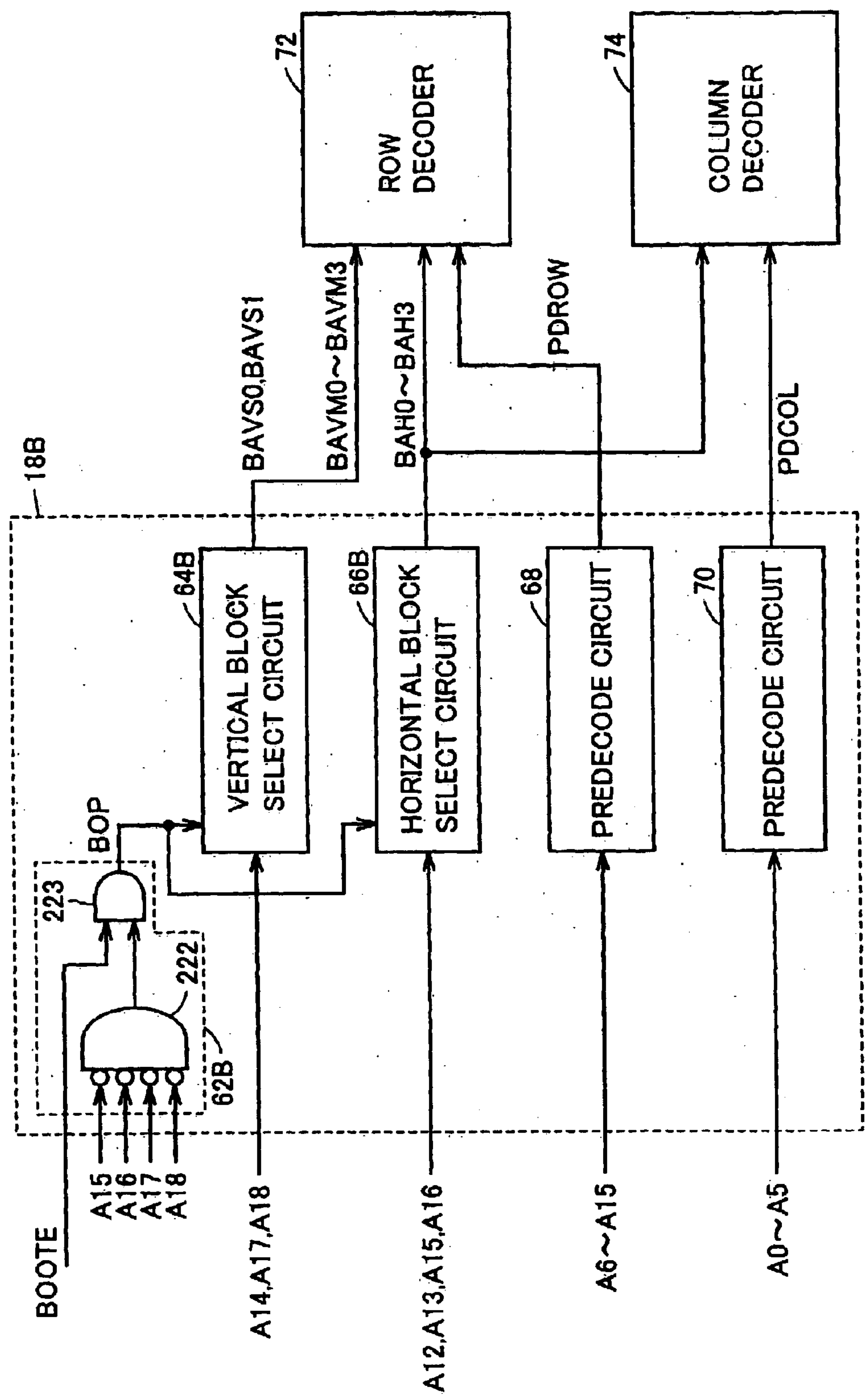
FIG. 18 is a block diagram of a configuration of a predecoder 18B according to a second embodiment.

FIG. 18 is a block diagram of a configuration of a predecoder 18B of the second embodiment.

Referring to FIG. 18, predecoder 18B includes a BOP generation circuit 62B, a vertical block select circuit 64B, and a horizontal block select circuit 66B instead of NOR circuit 62, vertical block select circuit 64 and horizontal block select circuit 66, respectively, based on the configuration of predecoder 18 described with reference to FIG. 6. The remaining, configuration of predecoder 18B is similar to that of predecoder 18 of FIG. 6. Therefore, description thereof will not be repeated.

BOP generation circuit 62B includes a 4-input NOR circuit 22 receiving address bits A15, A16, A17 and A18, and an AND circuit 223 receiving the output of NOR circuit 222 and signal BOOTE to output signal BOP.

In the previous first embodiment, signal BOP functions to switch the operation of the predecoder to select, when an address corresponding to non-used memory block B100 is input, memory blocks B000–B007 instead. In the configuration of FIG. 18 according to the second embodiment, signal BOP is always rendered inactive at an L level when signal BOOTE is at an L level. Blocks B000–B007 will not be selected, and block B100 of 32 k words is selected instead. Therefore, externally applied erasure designation is required only 16 times similar to memory array 700 described with reference to FIG. 30.

Figure 19:
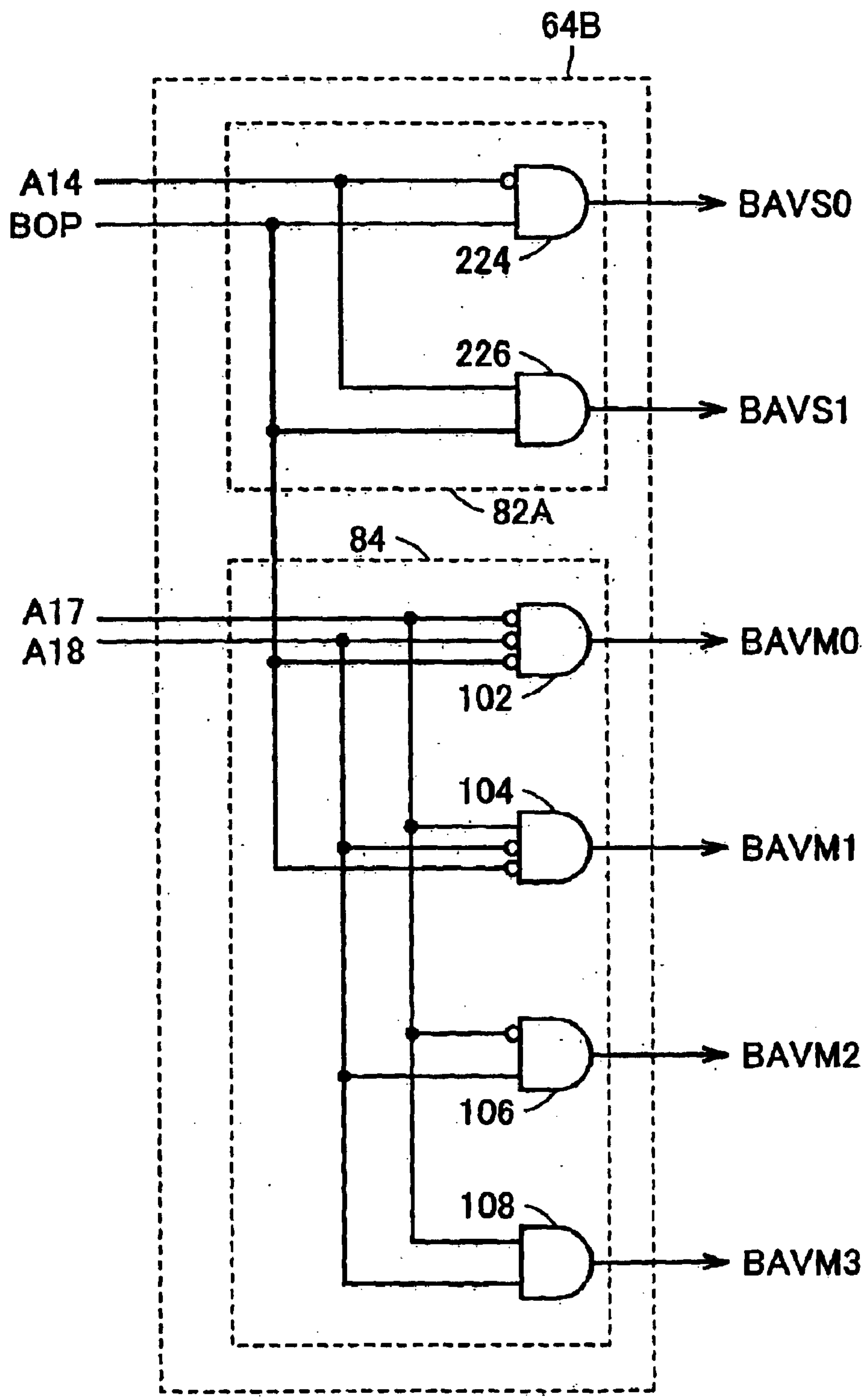
FIG. 19 is a circuit diagram of a configuration of a vertical block select circuit in FIG. 18.

FIG. 19 is a circuit diagram of a configuration of the vertical block select circuit of FIG. 18.

Referring to FIG. 19, vertical block select circuit 64B includes an address decode unit 82A instead of address decode unit 82, based on the configuration of vertical block select circuit 64 of FIG. 7. The remaining configuration of vertical block select circuit 64B is similar to that of vertical block select circuit 64 of FIG. 7. Therefore, description thereof will not be repeated.

Address decode unit 82A includes a gate circuit 224 inverting address bit A14 to output a signal BAVS0 when signal BOP is rendered active at an H level, and an AND circuit 226 receiving signal BOP and address bit A14 to output a signal BAVS1.

In the case where signal BOP is rendered inactive at an L level, signals BAVS0 and BAVS1 selecting a block in the vertical direction are both rendered inactive at an L level, corresponding to a state where memory blocks B000–B007 are not selected. In contrast, in the case where signal BOP is rendered active at an H level, one of signals BAVS0 and BAVS1 is rendered active at an H level in accordance with address bit A14, whereby any of memory blocks B000–B007 can be selected.

Figure 20:
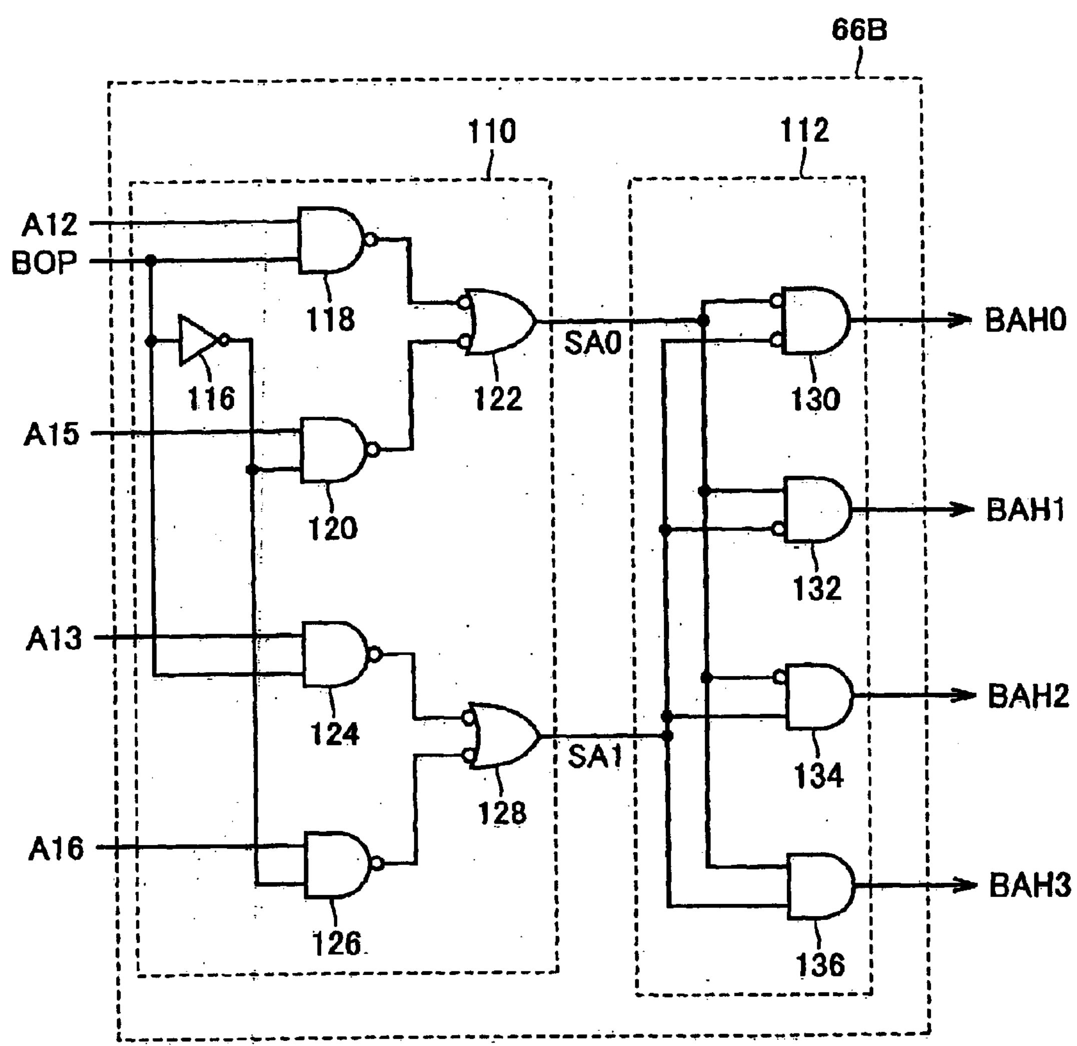
FIG. 20 is a circuit diagram of a configuration of a horizontal block select circuit of FIG. 18.

FIG. 20 is a circuit diagram of a configuration of the horizontal block select circuit of FIG. 18:

Referring to FIG. 20, vertical block select circuit 66B includes an address select unit 110 and an address decode unit 112. The configuration of address select unit 110 and address decode unit 112 have been already described with reference to FIG. 8. Therefore, description thereof will not be repeated here. It is to be noted that, in horizontal block select circuit 66B, signals BAH0, BAH1, BAH2 and BAH3 are output from decode gate circuits 130, 132, 134 and 136, respectively, of address decode unit 112, differing from those of FIG. 8.

Signal BOOTE of FIG. 18 is a signal determining whether a region of 4 k words is included or not, likewise the first embodiment. Signal BOOTE can be generated in the second embodiment through switch signal generation circuits 10, 10A, 10B and 10C described in the previous first embodiment. By directly controlling signal BOP through signal BOOTE at BOP generation circuit 62B of FIG. 18, memory blocks B000–B007 can be selected when signal BOP is at an H level and memory block B100 can be selected when signal BOP is at an L level. Thus, a flash memory having a memory block of 4 k words and a flash memory absent of a memory block of 4 k words can be implemented at the same time through one type.

In the above-described embodiments, the eight blocks of 4 k words are located only at the lower side (bottom side) of the address. A similar switching operation is allowed even in the case where the blocks are located at the higher side of the address (top side). Also, eight memory blocks of 4 k words can be positioned at both the bottom side and the top side.

[Application]

FIG. 21 is a diagram to explain a memory array of a dual boot type memory array in which a memory block of 4 k words is disposed at both the bottom side and the top side of an address region according to the present invention.

Referring to FIG. 21, a memory array 300 includes memory blocks B000–B007 corresponding to the bottom boot, memory blocks B008–B021 corresponding to the main block, and memory blocks B022–B029 corresponding to the top boot.

It is to be noted that the first region to be accessed by the CPU depends upon the type of CPU incorporated in the system where the non-volatile semiconductor memory device is used. In other words, there are two different manners of accessing. The requirement of a top boot and a bottom boot corresponds to these two manners.

In the case where the employed system corresponds to that of a bottom boot, memory blocks B000–B007 are configured as independent erasable blocks. Memory blocks B022–B029 are set erasable collectively through one erasure designation, or switching is to be conducted so as to select memory block B200 instead of memory blocks B022–B029, as in the first embodiment.

In the case where the employed system corresponds to that of a top boot, memory blocks B022–B029 are configured as independent erasure blocks. As described in the first embodiment, memory blocks B000–B007 are set erasable collectively through one erasure designation, or switching is conducted to select memory block B100 instead of selecting memory blocks B000–B007.

By applying the block select configuration of the present invention to a memory array capable of a dual boot, various configurations can be accommodated by producing one type of chip regardless of whether the system corresponds to a bottom boot type, a top boot type or a bootless type, and modifying the wire bonding, burning out a fuse, or altering the stored contents of a predetermined non-volatile memory cell.

In the case where a non-volatile memory corresponding to such a dual boot is employed by combining two chips, the problem of usability being degraded due to the presence of blocks of 4 k words intermittently present at the center of the address was conventionally noted. However, the present invention is advantageous in that various types of non-volatile memories can be implemented even in a 2-chip configuration by switching the non-volatile memory of the present invention to the top boot type, bottom boot type, and bootless type for usage in combination.

FIG. 22 is a diagram to describe a configuration implementing a dual boot corresponding to a combination of two chips.

Referring to FIG. 22, a memory 302 is implemented through the combination of a memory array 304 and the memory array 306. Memory array 304 is an implementation of memory array 300 of the dual boot type described with reference to FIG. 21 corresponding to a bottom boot whereas memory array 306 is an implementation of memory array 300 corresponding to a top boot. Accordingly, usability is improved since the discrete blocks of 4 k words at the center of the address is not viewable by the user.

Figure 23:
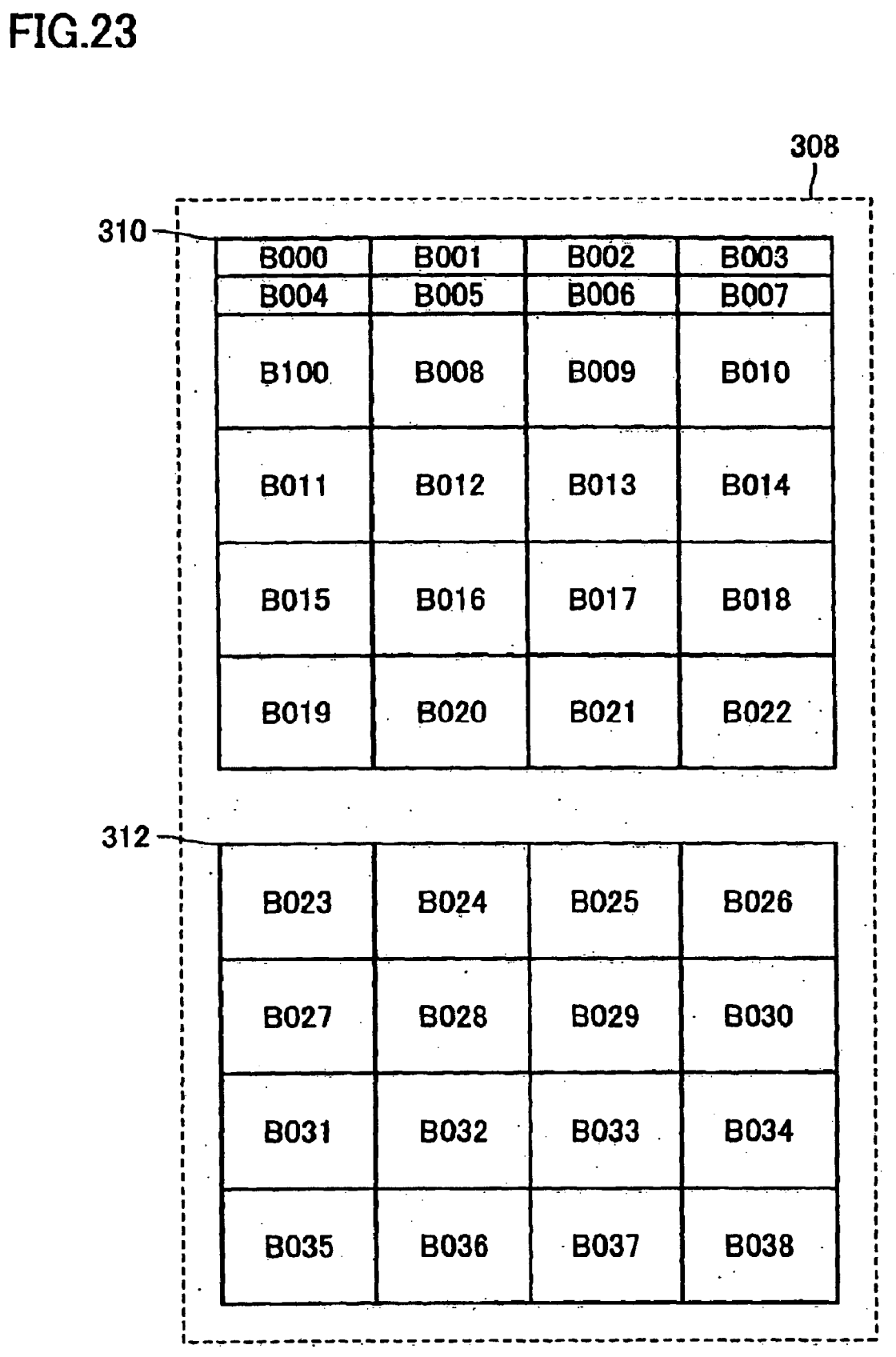

FIG. 23 is a diagram to describe a configuration implementing a bottom boot in the case where two chips are combined.

Referring to FIG. 23, a memory 308 is implemented by a combination of a memory array 310 and a memory array 312. Memory array 310 is an implementation of memory array 300 of a dual boot type described with reference to FIG. 21 corresponding to a bottom boot, whereas memory array 312 is an implementation of memory array 300 corresponding to a bootless type. The usability is improved since the discrete blocks of 4 k words at the center and top portions of the address are not viewable by the user.

FIG. 24 is a diagram to explain a configuration of implementing a top boot in the case where two chips are combined.

Referring to FIG. 24, memory 314 is implemented by combining a memory array 316 and memory array 318. Memory array 316 is an implementation of memory array 300 of a dual boot type described with reference to FIG. 21 corresponding to a bootless type, whereas memory array 318 is an implementation of memory array 300 corresponding to a top boot type. The usability is improved since the discrete blocks of 4 k words at the center and bottom portions of address is not viewable by the user.

Figure 25:
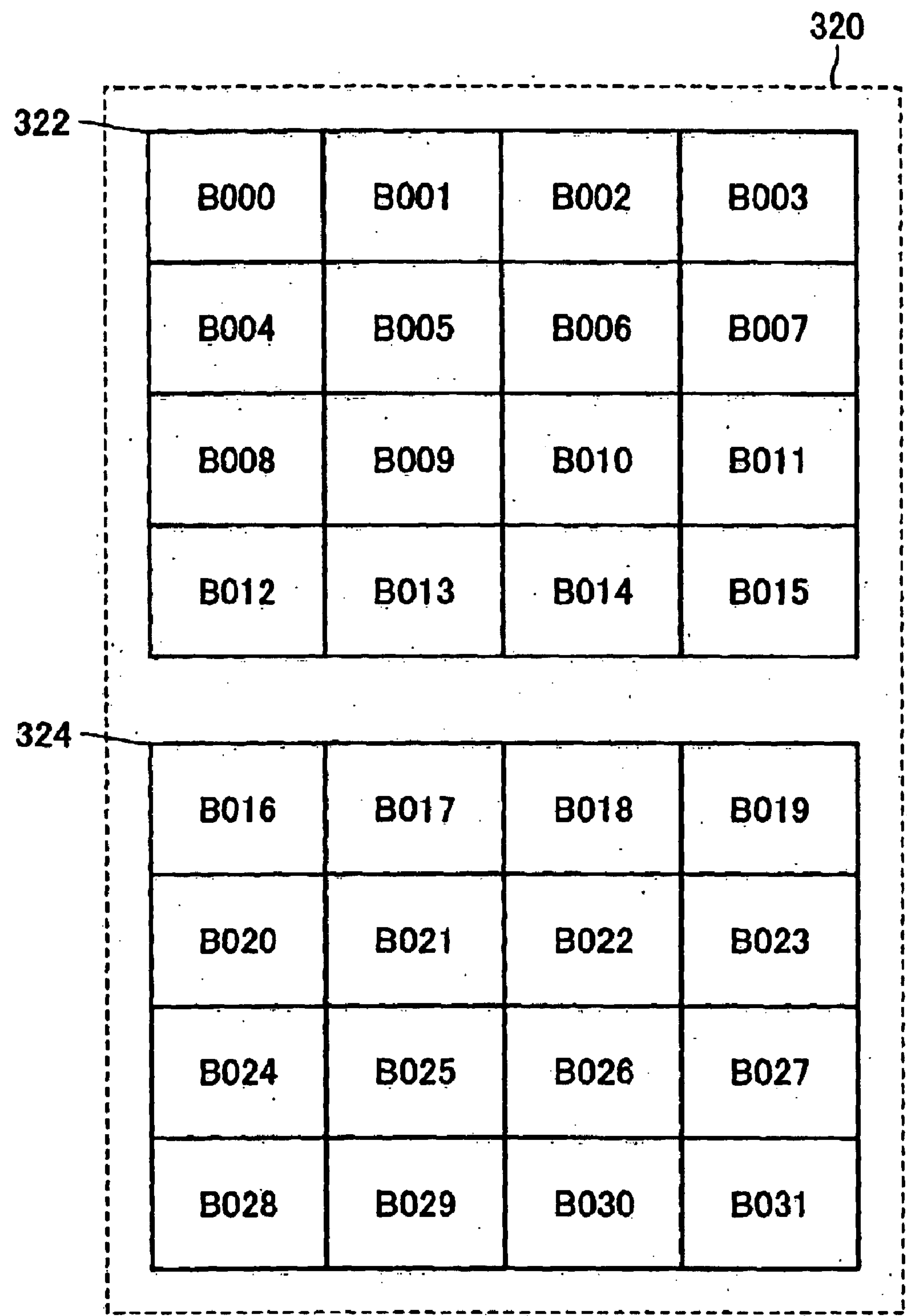
FIG. 25 is a diagram to explain a configuration of implementing a bootless type in the case where two chips are combined.
Figure 26:
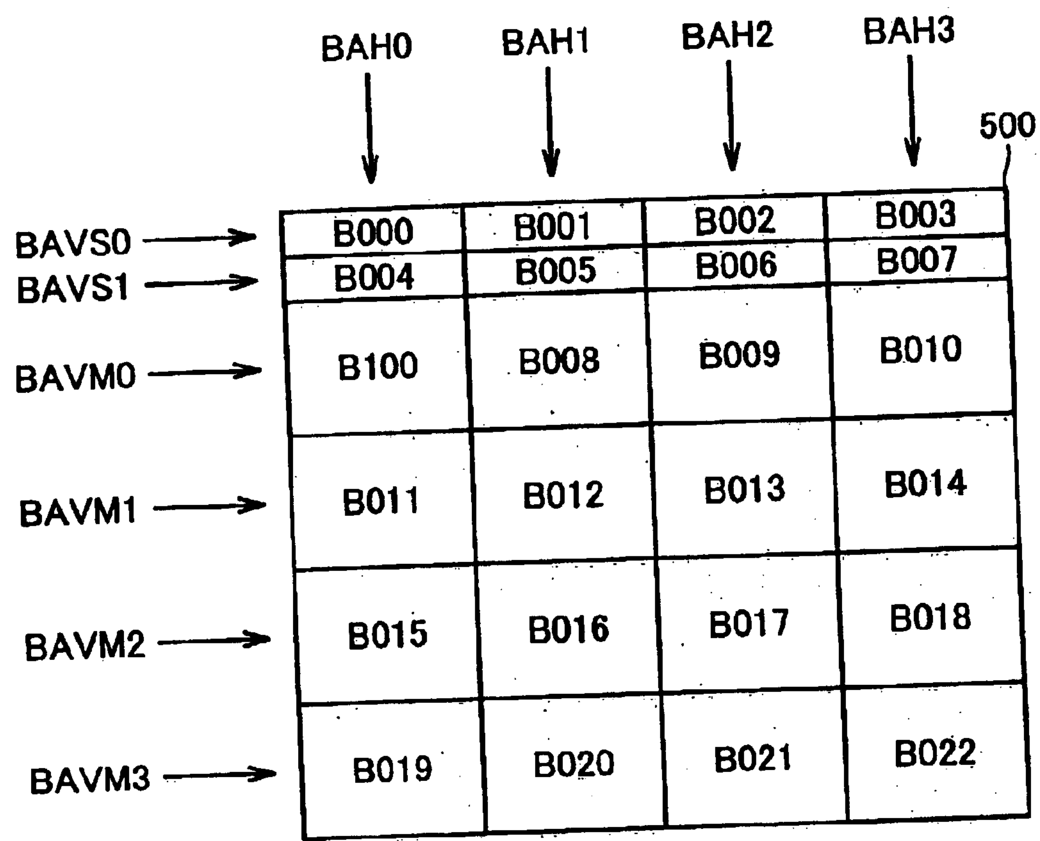
FIG. 26 shows an array configuration of a conventional flash memory.

FIG. 25 is a diagram to explain a configuration of implementing a bootless type in the case where two chips are combined.

Referring to FIG. 25, memory 320 is implemented by a combination of a memory array 322 and a memory 324. Memory arrays 322 and 324 are implementations of memory array 300 of the dual boot type described with reference to FIG. 21 corresponding to a bootless type. The usability is improved since the discrete blocks of 4 k words at the top portion, center, and bottom portions of the address are not viewable by the user.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device comprising:

a first basic memory block having a plurality of memory cells arranged in a matrix and having a first storage capacity corresponding to a unit of collective erasure, said collective erasure not allowed in a partial region of said first basic memory block, said partial region of said first basic memory block having a second storage capacity smaller than said first storage capacity;

a plurality of second basic memory blocks provided independent of said first basic memory block, each having a plurality of memory cells arranged in a matrix and each having said second storage capacity, a total storage capacity of said plurality of second basic memory blocks being equal to said first storage capacity; and an erasure control circuit switching, in accordance with a switching signal, between a first operation of erasing one of said plurality of second basic memory blocks in accordance with an erasure command, and a second operation of erasing said plurality of second basic memory blocks collectively in accordance with said erasure command.

2. The non-volatile semiconductor memory device according to claim 1, wherein at least one of said plurality of second basic memory blocks includes a boot block read at a start of a system in which said non-volatile semiconductor memory device is used.

3. The non-volatile semiconductor memory device according to claim 1, wherein at least one of said plurality of second basic memory blocks includes a memory block for programming data that is expected to be rewritten more frequently than data to be programmed into said first basic memory block.

4. The non-volatile semiconductor memory device according to claim 1, further comprising:

a lead supplying a predetermined fixed potential; and a pad to switch a polarity of said switch signal with respect to said erasure control circuit, wherein said erasure control circuit includes a select signal generation circuit setting said switch signal at a first polarity when wire bonding is established between said lead and said pad.

5. The non-volatile semiconductor memory device according to claim 1, wherein said erasure control circuit comprises a switch signal generation circuit providing said switch signal, said switch signal generation circuit includes a non-volatile storage element to determine said switch signal in accordance with stored contents.

6. The non-volatile semiconductor memory device according to claim 5, wherein said non-volatile storage element is a fuse element determining said switch signal in accordance with absence/presence of connection.

7. The non-volatile semiconductor memory device according to claim 5, wherein said non-volatile storage element has a structure identical to the structure of a non-volatile memory cell included in said first and second basic memory blocks.

8. The non-volatile semiconductor memory device according to claim 1, wherein said erasure control circuit selects said plurality of second basic memory blocks together when a pulse is to be applied collectively to a plurality of non-volatile memory cells in the case of said second operation.

9. The non-volatile semiconductor memory device according to claim 1, wherein said erasure control circuit sequentially selects said plurality of second basic memory blocks, and initiates an erasure operation of a subsequent basic memory block of a selected basic memory block after erasure of said selected basic memory block is completed in the case of said second operation.

10. The non-volatile semiconductor memory device according to claim 1, wherein said plurality of second basic memory blocks and said first basic memory block are allocated a predetermined address region, said plurality of second basic memory blocks are arranged at a most significant side of said predetermined address region.

11. The non-volatile semiconductor memory device according to claim 1, wherein said plurality of second basic memory blocks and said first basic memory block are allocated a predetermined address region, said plurality of second basic memory blocks are arranged at a least significant side of said predetermined address region.

12. The non-volatile semiconductor memory device according to claim 1, further comprising a plurality of third basic memory blocks corresponding to a unit of collective erasure, each third basic memory block having a storage capacity smaller than the storage capacity of said first basic memory block, wherein said plurality of third basic memory blocks, said plurality of second basic memory blocks, and said first basic memory block are allocated a predetermined address region, and one of said plurality of second basic memory blocks and said plurality of third basic memory blocks are arranged at a most significant side in said predetermined address region, and the other of said plurality of second basic memory blocks and said plurality of third basic memory blocks are arranged at a least significant side of said predetermined address region.

13. A non-volatile semiconductor memory device comprising:

a first basic memory block having a plurality of memory cells arranged in a matrix and having a first storage capacity corresponding to a unit of collective erasure, said collective erasure not allowed in a partial region of said first basic memory block, said partial region of said first basic memory block having a second storage capacity smaller than said first storage capacity;

a plurality of second basic memory blocks provided independent of said first basic memory block, each having a plurality of memory cells arranged in a matrix and each having said second storage capacity, a total storage capacity of said plurality of second basic memory blocks being equal to said first storage capacity; and an erasure control circuit switching, in accordance with a switch signal, between a first operation of erasing one of said plurality of second basic memory blocks in accordance with an erasure command, and a second operation of erasing said first basic memory block in accordance with said erasure command.

14. The non-volatile semiconductor memory device according to claim 13, further comprising:

a lead providing a predetermined fixed potential; and a pad to switch a polarity of said switch signal with respect to said erasure control circuit, wherein said erasure control circuit includes a switch signal generation circuit setting said switch signal at a first polarity when wire bonding is established between said lead and said pad.

15. The non-volatile semiconductor memory device according to claim 13, wherein said erasure control circuit includes a switch signal generation circuit providing said switch signal, said switch signal generation circuit includes a non-volatile storage element to determine said switch signal in accordance with stored content.

16. The non-volatile semiconductor memory device according to claim 15, wherein said non-volatile storage element includes a fuse element determining said switch signal in accordance with absence/presence of connection.

17. The non-volatile semiconductor memory device according to claim 15, wherein said non-volatile storage element has a configuration identical to the configuration of a non-volatile memory cell included in said first and second basic memory blocks.

18. The non-volatile semiconductor memory device according to claim 13, wherein said plurality of second basic memory blocks and said first basic memory block are allocated a predetermined address region, said plurality of second basic memory blocks are arranged at a most significant side of said predetermined address region.

19. The non-volatile semiconductor memory device according to claim 13, wherein said plurality of second basic memory blocks and said first basic memory block are allocated a predetermined address region, said plurality of second basic memory blocks are arranged at a most significant side of said predetermined address region.

20. The non-volatile semiconductor memory device according to claim 13, further comprising a plurality of third basic memory blocks corresponding to a unit of collective erasure, each third basic memory block having a storage capacity smaller than the storage capacity of said first basic memory block, wherein said plurality of third basic memory block, said plurality of second basic memory blocks, and said first basic memory block are allocated a predetermined address region, and one of said plurality of second basic memory blocks and said plurality of third basic memory blocks are arranged at a most significant side of said predetermined address region, and the other of said plurality of second basic memory blocks and said plurality of third basic memory blocks are arranged at a least significant side of said predetermined address region.

* * * * *